(12) United States Patent
Okamoto et al.

(10) Patent No.: US 9,388,308 B2
(45) Date of Patent: Jul. 12, 2016

(54) CURABLE RESIN COMPOSITION, COMPOSITION FOR FORMING SOLDER RESIST, DRY FILM AND PRINTED WIRING BOARD, AND LAMINATE AND PROCESS FOR PREPARING THE SAME

(71) Applicant: TAIYO INK MFG. CO., LTD., Hiki-gun (JP)

(72) Inventors: Daichi Okamoto, Hiki-gun (JP); Shoji Minegishi, Hiki-gun (JP)

(73) Assignee: TAIYO INK MFG. CO., LTD., Hiki-gun (JP)

( * ) Notice: Subject to any disclaimer, the term of this patent is extended or adjusted under 35 U.S.C. 154(b) by 0 days.

(21) Appl. No.: 14/432,029

(22) PCT Filed: Sep. 26, 2013

(86) PCT No.: PCT/JP2013/076085
§ 371 (c)(1),
(2) Date: Mar. 27, 2015

(87) PCT Pub. No.: WO2014/050977
PCT Pub. Date: Apr. 3, 2014

(65) Prior Publication Data
US 2015/0240071 A1    Aug. 27, 2015

(30) Foreign Application Priority Data

Sep. 28, 2012   (JP) .................................. 2012-216614
Sep. 28, 2012   (JP) .................................. 2012-216636
Aug. 5, 2013    (JP) .................................. 2013-162258

(51) Int. Cl.
C08L 63/10       (2006.01)
C08L 63/00       (2006.01)
C08L 101/08      (2006.01)
(Continued)

(52) U.S. Cl.
CPC ................. *C08L 63/10* (2013.01); *C08J 3/243* (2013.01); *C08J 5/18* (2013.01); *C08L 63/00* (2013.01);
(Continued)

(58) Field of Classification Search
None
See application file for complete search history.

(56) References Cited

U.S. PATENT DOCUMENTS 4,797,455 A * 1/1989 Lin ...................... C07D 231/12
525/504
5,599,855 A * 2/1997 Walker ................. C08G 59/184
523/404
(Continued)

FOREIGN PATENT DOCUMENTS

JP   61-243869    10/1986
JP   2000-290260  10/2000
(Continued)

OTHER PUBLICATIONS

International Search Report issued Nov. 5, 2013, in PCT/JP2013/076085, filed Sep. 26, 2013.

*Primary Examiner* — Bruce H Hess
*Assistant Examiner* — Christopher Polley
(74) *Attorney, Agent, or Firm* — Oblon, McClelland, Maier & Neustadt, L.L.P.

(57) ABSTRACT

The present invention provides a curable resin composition that can provide a cured material excellent in insulation reliability while maintaining adhesiveness and provide a composition for forming a solder resist, a dry film and a printed wiring board, a laminate having a resin insulating layer excellent in insulation reliability while maintaining adhesiveness, a dry film for forming this and a process for preparing a laminate using the dry film. The curable resin composition contains (A) an imidazole-isocyanate adduct, (B) a carboxyl group-containing resin and (C) a thermosetting resin. The above laminate has a substrate and a plurality of resin insulating layers formed on the substrate, in which one of the plural resin insulating layers in contact with the substrate is a layer formed of the curable resin composition.

20 Claims, 1 Drawing Sheet

| L2 |
|---|
| L1 |
| S |

(51) Int. Cl.
*H05K 3/28* (2006.01)
*C08J 3/24* (2006.01)
*C08J 5/18* (2006.01)

(52) U.S. Cl.
CPC .............. *C08L 101/08* (2013.01); *H05K 3/287* (2013.01); *C08J 2363/00* (2013.01); *Y10T 428/24802* (2015.01); *Y10T 428/31551* (2015.04)

(56) References Cited

U.S. PATENT DOCUMENTS 6,812,269 B2 * 11/2004 Koenraadt ............... C08J 3/205
516/99

| | | | |
|---|---|---|---|
| 2010/0280192 | A1 | 11/2010 | Foo et al. |
| 2010/0280211 | A1 | 11/2010 | Foo et al. |

FOREIGN PATENT DOCUMENTS

| | | |
|---|---|---|
| JP | 2001-209175 | 8/2001 |
| JP | 2001-305726 | 11/2001 |
| JP | 2001-324805 | 11/2001 |
| JP | 2007-197530 | 8/2007 |
| JP | 2009-185181 | 8/2009 |
| JP | 2009-272485 | 11/2009 |
| JP | 2010-261032 | 11/2010 |
| JP | 2012-17444 | 1/2012 |
| WO | WO 2011/122028 A1 | 10/2011 |

* cited by examiner

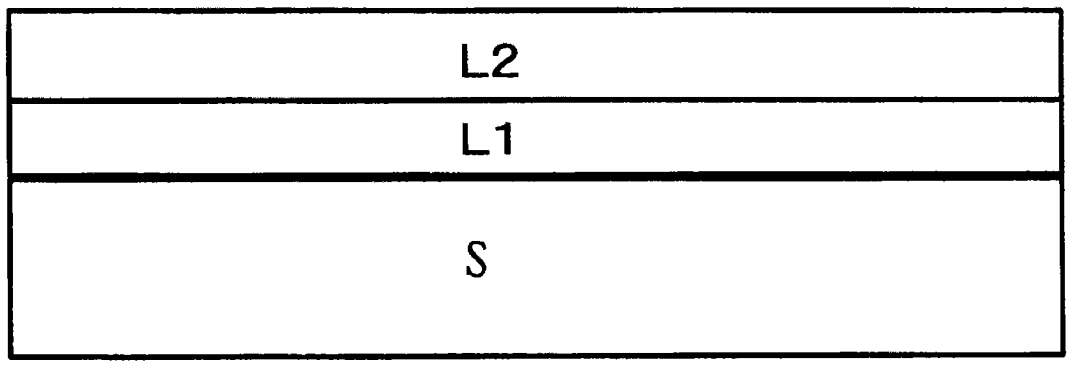

CURABLE RESIN COMPOSITION, COMPOSITION FOR FORMING SOLDER RESIST, DRY FILM AND PRINTED WIRING BOARD, AND LAMINATE AND PROCESS FOR PREPARING THE SAME

TECHNICAL FIELD

The present invention relates to a curable resin composition, particularly, a curable resin composition for forming a solder resist for use in a printed wiring board, and a dry film and printed wiring board using the curable resin composition. The present invention further relates to a laminate, particularly a laminate for use in a printed wiring board having a solder resist, a dry film for use in forming the laminate and a process for preparing the laminate.

BACKGROUND ART

Recently, with the tendency for lighter and more compact electronic devices (electronics), the density of printed wiring boards has been increased. In response to the increase of the density, it is required that a curable resin composition for forming a resin insulating layer such as a solder resist be improved in performance and workability. With the tendency for lighter, more compact and higher performance of electronic equipment, semiconductor packages reduced in size and increased in number of pins have been put into practical use, and mass production thereof has been accelerated. To deal with the increase of the density, IC packages called e.g., QFP (quad flatpack package) and SOP (small outline package) have been replaced by newly introduced IC packages called e.g., BGA (ball grid array) and CSP (tip scale package). In a substrate for such a package and a printed wiring board for use in automobiles, solder resists are used. For the solder resists, various photosensitive resin compositions have been proposed in the art (see, for example, Patent Documents 1, 2).

In a printed wiring board having fine-pitch wiring patterns such as a package substrate, highly dense wiring patterns are formed mutually close to each other. For the reason, the frequency of short circuit and crosstalk noise occurring between lines of the wiring pattern may increase. Accordingly, high reliability for insulation is required for a high performance solder resist for use in package substrates.

In the meantime, electrical control of automobiles, particularly the driving portions has been accelerated. Under the circumstance, a printed wiring board is increasingly installed in locations having high environment temperature, such as an engine room and peripheral portions thereof. Depending on the installation locations, the printed wiring board for automobiles will be placed in high-temperature conditions of 80° C. to 150° C. for a long term period.

Accordingly, a high performance solder resist for use in an automobile printed wiring board is required to have high insulation reliability in high-temperature conditions.

Prior to forming a resin insulating layer such as a solder resist on a substrate, usually a pretreatment for roughening a surface is applied to the substrate in order to improve adhesiveness of the resin insulating layer to the substrate. However, the pretreatment method for a substrate varies depending on the use. In some cases where a strong roughening treatment is not applied, a sufficient anchor effect is not expected. Thus, it is necessary for the resin insulating layer to have sufficient adhesiveness to a substrate regardless of what pretreatment method is applied.

A wide variety of resin compositions having excellent adhesiveness have been known. For example, Patent Document 3 discloses a curable epoxy composition containing an imidazole-isocyanate adduct as an epoxy curing agent, as an adhesive. However, the adhesive composed of an epoxy resin and using such an imidazole-isocyanate adduct as a curing agent fails to satisfy various properties (e.g., resistance to plating, durability, insulating property) required for a resin insulating layer such as a solder resist. The Document 3 is not concerned with the formation of a solder resist pattern by light exposure.

PRIOR ART LITERATURE

Patent Document

[Patent Document 1] Japanese Patent Laid-Open No. 61-243869
[Patent Document 2] Japanese Patent Laid-Open No. 2009-272485
[Patent Document 3] Japanese Patent Laid-Open No. 2010-261032

SUMMARY OF INVENTION

Problem to be Solved by the Invention

As described above, insulation reliability of a resin insulating layer such as a solder resist and adhesiveness to a substrate of the resin insulating layer have been increasingly required year after year, whereas it is difficult to satisfy both properties and research and development is further required.

An object of the present invention is to provide a curable resin composition, which overcomes problems in the related art as described above and can provide a cured material having excellent insulation reliability with maintaining adhesiveness and provide a composition for forming a solder resist, and a dry film and printed wiring board using the curable resin composition.

Another object of the present invention is to provide a laminate having a resin insulating layer, which overcomes problems in the related art as described above and has excellent insulation reliability while maintaining adhesiveness, and provide a dry film for preparing the laminate and a process for preparing the laminate using the dry film.

Means for Solving the Problem

The present inventors have conducted studies on various materials with a view to improving adhesiveness with maintaining inherent properties of a solder resist. From the studies, they have found that the use of the imidazole-isocyanate adduct described in Patent Document 3 as a catalyst for a curable resin is extremely useful for improving adhesiveness of a solder resist. Patent Literature 3 does not suggest that an imidazole-isocyanate adduct is useful as a catalyst for a curable resin for forming a resin insulating layer such as a solder resist, as mentioned above.

In the above studies, the present inventors have found that if an imidazole-isocyanate adduct is applied as a curing catalyst to a combination of the curable resins consisting of a carboxyl group-containing resin and a thermosetting resin, the reactions of both resins satisfactorily proceed and the aforementioned object can be attained without producing any defects in pattern formation of a solder resist by light exposure.

The present inventors have found a laminate having the resin insulating layers obtained by curing a plurality of curable resin layers which include a curable resin layer excellent in adhesiveness obtained by using an imidazole-isocyanate adduct as a curing catalyst, and at least one curable resin layer excellent in other properties such as insulating property, the laminate being satisfactory for forming a pattern by light exposure and satisfies the aforementioned object. Based on the findings, the present invention was accomplished.

More specifically, the present invention provides a curable resin composition containing (A) an imidazole-isocyanate adduct, (B) a carboxyl group-containing resin and (C) a thermosetting resin.

Preferred embodiments of the curable resin composition of the present invention will be described below.

(1) The imidazole-isocyanate adduct is a compound represented by formula A:

[Formula 1]

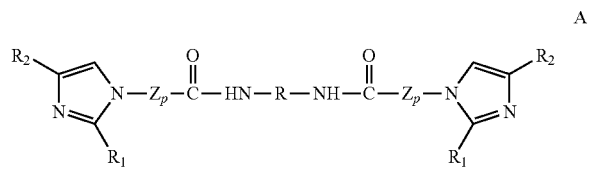

wherein Z represents $(CH_2)_n$—NH; N of NH is arranged so as to bond to C of CO; p is 0 to 1; n is 3 to 8; R represents $(CH_2)_m$ (m is 2 to 8) or a polyvalent residue of a polymethylene poly(phenylisocyanate) having an average isocyanate functionality of 2.1 to 3.5; and $R_1$ and $R_2$ each independently represent hydrogen, a $C_1$-$C_{20}$ linear or branched alkyl group, a $C_6$-$C_{10}$ aryl, alkylaryl or arylalkyl group, or a $C_5$-$C_6$ alicyclic group. Thereby, more excellent adhesiveness to a substrate can be obtained.

However, the above numerical values of p, n and m are average values of total molecules. In the case of a polyvalent residue of a polymethylene poly(phenylisocyanate) wherein R has an average isocyanate functionality of 2.1 to 3.5, though the number of bonds of R is not two as described above but 2.1 to 3.5 in average, each bond binds to a —NHCO-Zp-imidazole group shown in the right and left of R.

(2) The imidazole-isocyanate adduct is a compound represented by formula C:

[Formula 2]

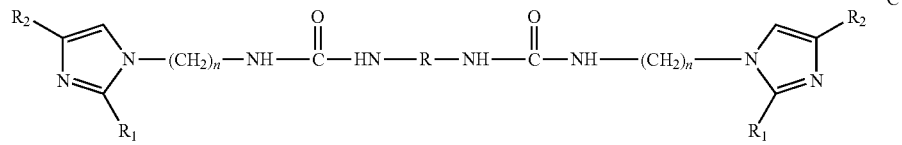 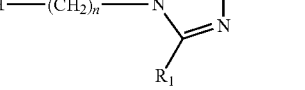

wherein n is 3 to 8; R represents $(CH_2)_m$ (m is 2 to 8) or a polyvalent residue of a polymethylene poly(phenylisocyanate) having an average isocyanate functionality of 2.1 to 3.5; and $R_1$ and $R_2$ each independently represent hydrogen, a $C_1$-$C_{20}$ linear or branched alkyl, a $C_6$-$C_{10}$ aryl, alkylaryl or arylalkyl, or a $C_5$-$C_6$ alicyclic group. Thereby, adhesiveness to a substrate can be further improved.

(3) The thermosetting resin (C) is an epoxy resin (epoxy compound). The thermosetting resin (C) is a component for thermal curing the carboxyl group-containing resin (B), and the use of the epoxy resin brings about more excellent durability.

(4) (D) a photopolymerization initiator and (E) a reactive diluent are further contained. Thereby, pattern formation by light exposure can be made.

(5) The carboxyl group-containing resin (B) has an ethylenically unsaturated double bond in its molecule. Pattern formation by light exposure can be easily made.

The present invention provides a curable resin composition for forming a solder resist which contains the curable resin composition of the present invention.

When the curable resin composition of the present invention is used, for example, as a curable resin composition for forming a solder resist, a two pack composition is usually used (in general, one of the two packs contains an imidazole-isocyanate adduct, a carboxyl group-containing resin and an optional component and the other pack contains a thermosetting resin). However, since the imidazole-isocyanate adduct used as a curing catalyst in the present invention is excellent in stability even if it is added to a carboxyl group-containing resin and a thermosetting resin, the curable resin composition can be used as a single pack composition.

The present invention further provides a dry film having a curable resin layer containing the curable resin composition of the present invention.

A preferred embodiment of the curable resin composition of the present invention can be applied to the dry film of the present invention.

The present invention further provides a printed wiring board having a resin insulating layer obtained by thermally curing a curable resin layer containing the curable resin composition of the present invention.

A preferred embodiment of the curable resin composition of the present invention can be applied to the printed wiring board of the present invention.

The present invention further provides a laminate having a substrate and a plurality of resin insulating layers formed on the substrate, in which one of the plural resin insulating layers which is in contact with the substrate is a layer formed of the curable resin composition of the present invention.

Preferred embodiments of the laminate of the present invention will be described below.

(1) At least one resin insulating layer except the resin insulating layer in contact with the substrate is formed of a different curable resin composition from that of the resin insulating layer in contact with the substrate. The adhesiveness to the substrate is further improved, and at the same time, other properties can be improved by the presence of the other resin insulating layer(s). As the other properties, insulating property is preferred.

(2) At least one resin insulating layer except the resin insulating layer in contact with the substrate is formed of a curable resin composition containing no imidazole-isocyanate adduct. The adhesiveness to the substrate is further improved; at the same time, other properties (preferably insulating property) can be improved by the presence of the other resin insulating layer(s).

(3) At least one resin insulating layer except the resin insulating layer in contact with the substrate is formed of a curable resin composition containing a P atom-containing curing accelerator. The adhesiveness to the substrate is further improved, and at the same time, insulating property, in particular, can be improved by the presence of the other resin insulating layer(s).

(4) The curable resin composition for the resin insulating layer in contact with the substrate further contains a photopolymerization initiator and a reactive diluent. Thereby, pattern formation by light exposure can be made.

Further, the present invention provides a laminate having a substrate and a plurality of resin insulating layers formed on the substrate, in which one of the plural resin insulating layers which is in contact with the substrate is a layer formed of a curable resin composition containing at least an imidazole-isocyanate adduct.

The present invention further provides a dry film for use in preparing the laminate of the present invention, having
  a film; and
  a plurality of curable resin layers formed on the film,
  in which one of the plural curable resin layers in contact with the film or an outermost layer of the plural curable resin layers is a layer formed of a curable resin composition containing an imidazole-isocyanate adduct.

The preferred embodiments of the laminate of the present invention can be applied to the dry film of the present invention.

The present invention further provides a process for preparing a laminate, including a step of laminating the dry film of the present invention on the substrate such that a curable resin layer formed of a curable resin composition containing the imidazole-isocyanate adduct comes into contact with a surface of the substrate.

The preferred embodiments of the laminate of the present invention can be applied to the process for preparing a laminate of the present invention.

Effects of Invention

A cured layer formed of the curable resin composition of the present invention is excellent in adhesiveness to a substrate and insulation reliability. This is considered because (A) an imidazole-isocyanate adduct is used as a curing catalyst for (B) a carboxyl group-containing resin and (C) a thermosetting resin, with the result that a reaction between these resins is appropriately accelerated to form a cured layer having both excellent insulating property and excellent adhesiveness. In more detail, the resultant cured layer has excellent adhesiveness to a substrate while maintaining various properties (e.g., resistance to plating, durability, insulating property) required for a resin insulating layer such as a solder resist and additionally properties for forming a solder resist pattern (photo-curing property and resolution) by light exposure. Further, since an imidazole-isocyanate adduct is excellent in stability when it is added to a carboxyl group-containing resin and a thermosetting resin, the curable resin composition can be used as a single pack composition and is excellent in view of handling. For the reason, a composition for forming a solder resist using the composition of the present invention, a dry film and a printed wiring board have excellent properties similarly to the above.

Furthermore, a plurality of resin insulating layers in the laminate of the present invention are also excellent in both adhesiveness to a substrate and insulation reliability. This is attained by providing a resin insulating layer formed of the curable resin composition of the present invention having excellent properties such as adhesiveness so as to be in contact with a substrate and further providing thereon at least one of other layers, for example, a resin insulating layer having excellent other properties such as insulating property. More specifically, the resin insulating layer formed of the curable resin composition of the present invention is excellent in not only e.g., adhesiveness but also insulating property, and further the formation of another layer improving other properties including insulating property greatly enhances not only adhesiveness and insulation reliability but also other properties.

In other words, such a plurality of resin insulating layers have excellent adhesiveness to a substrate with maintaining various properties (e.g., resistance to plating, durability, insulating property) required for a resin insulating layer such as a solder resist and solder resist pattern formation properties (photo-curing property and resolution) by light exposure. For the reason, the dry film for use in preparing a laminate of the present invention and the process for preparing the laminate also have high advantage as above.

BRIEF DESCRIPTION OF DRAWING

FIG. 1 is a schematic view showing a basic structure of a laminate of the present invention.

MODE FOR CARRYING OUT THE INVENTION

The curable resin composition of the present invention has (A) an imidazole-isocyanate adduct, (B) a carboxyl group-containing resin and (C) a thermosetting component as essential components. Thereby, an excellent insulating property and excellent adhesiveness can be simultaneously obtained.

[(A) Imidazole-isocyanate Adduct]

When an imidazole-isocyanate adduct is added to a mixture of (B) a carboxyl group-containing resin and (C) a thermosetting component, the imidazole-isocyanate adduct serves as a reaction catalyst and surprisingly can further improve adhesiveness of a resultant cured layer to a substrate.

An imidazole-isocyanate adduct is a compound generally represented by formula A:

[Formula 3]

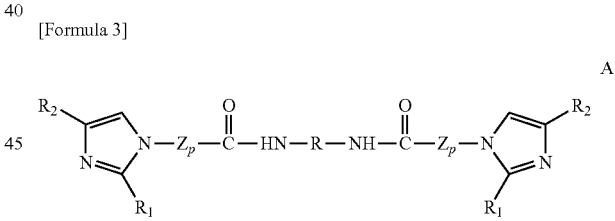

wherein Z represents $(CH_2)_n$—NH; N of NH is arranged so as to bond to C of CO; p is 0 to 1; n is 3 to 8; R represents $(CH_2)_m$ (m is 2 to 8) or a polyvalent residue of a polymethylene poly(phenylisocyanate) having an average isocyanate functionality of 2.1 to 3.5; and $R_1$ and $R_2$ each independently represent hydrogen, a $C_1$-$C_{20}$ linear or branched alkyl, a $C_6$-$C_{10}$ aryl, alkylaryl or arylalkyl, or a $C_5$-$C_6$ alicyclic group. The numerical values of p, n and m are average values of total molecules. In the case of a polyvalent residue of a polymethylene poly(phenylisocyanate) wherein R has an average isocyanate functionality of 2.1 to 3.5, the number of bonds of R is not two as described above but 2.1 to 3.5 in average and each bond (i.e., the case where the number of bonds is 3 or more excluding 1 and 2) binds to a —NHCO-Zp-imidazole group shown in the right and left of R.

The above imidazole-isocyanate adduct is preferably a compound represented by formula A wherein p is 1, in other words, a compound represented by the following formula C:

[Formula 4]

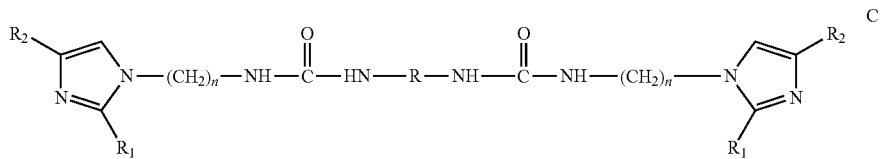

wherein n is 3 to 8; R is $(CH_2)_m$ (m is 2 to 8) or a polyvalent residue of a polymethylene poly(phenylisocyanate) having an average isocyanate functionality of 2.1 to 3.5; and $R_1$ and $R_2$ each independently represent hydrogen, a $C_1$-$C_{20}$ linear or branched alkyl, a $C_6$-$C_{10}$ aryl, alkylaryl or arylalkyl, or a $C_5$-$C_6$ alicyclic group.

The imidazole-isocyanate adduct used in the present invention is preferably a reaction product between an imidazole and a polymethylene diisocyanate having 2 to 8 methylene units or an imidazole-isocyanate adduct containing a reaction product between an imidazole and a polymethylene poly(phenylisocyanate) having an isocyanate functionality of 2.1 to 3.5.

In the above Formulas A and C, n is preferably 3 to 6.

R is preferably butanediyl, hexanediyl, octanediyl (particularly hexanediyl) or a polyvalent residue of a polymethylene poly(phenylisocyanate) having an isocyanate functionality of 2.1 to 3.5. It is preferable that $R_1$ and $R_2$ be each individually hydrogen, a $C_1$-$C_4$ linear or branched alkyl, a $C_6$-$C_8$ aryl, alkylaryl or arylalkyl, and particularly preferably selected, singly or in combination, from the group consisting of hydrogen, methyl and ethyl.

Preferable examples of the alkyl group include methyl, ethyl, n-propyl, isopropyl, n-butyl, iso-butyl, sec-butyl, tert-butyl, 2-ethylhexyl, octyl, decyl, dodecyl and heptadecyl.

Preferable examples of the aryl group include phenyl and naphthyl. Preferable examples of the arylalkyl group include benzyl and phenylethyl. Preferable examples of the alkylaryl group include tolyl, xylyl and ethylphenyl. Preferable examples of the $C_5$-$C_6$ alicyclic group include cyclopentyl and cyclohexyl.

It is particularly preferable that $R_1$ and $R_2$ be each independently hydrogen, methyl, ethyl, a linear or branched propyl or butyl, benzyl, phenylethyl, cyclopentyl and cyclohexyl. Particularly, $R_1$ and $R_2$ are each independently hydrogen, methyl or ethyl and particularly preferably hydrogen.

The imidazole-isocyanate adduct of the present invention may be any one of the following compounds. In more details, a compound represented by the following formula E:

[Formula 5]

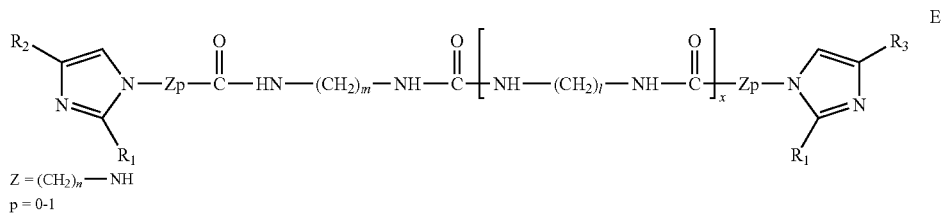

wherein x is 0 to 10; n is 3 to 8; m is 2 to 8; l is 2 to 10; and $R_1$ and $R_2$ each independently represent hydrogen, a $C_1$-$C_{20}$ linear or branched alkyl, a $C_6$-$C_{10}$ aryl, alkylaryl or arylalkyl, or a $C_5$-$C_6$ alicyclic group, a compound represented by the following formula F:

[Formula 6]

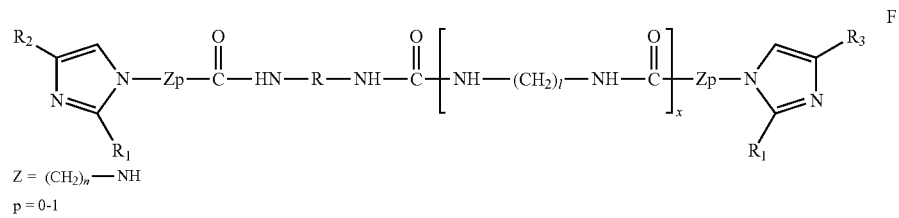

wherein x is 0 to 10; n is 3 to 8; l is 2 to 10; R is $(CH_2)_m$ (m is 2 to 8) or a polyvalent residue of a polymethylene poly(phenylisocyanate) having an isocyanate functionality of 2.1 to 3.5; and $R_1$ and $R_2$ each independently represent hydrogen, a $C_1$-$C_{20}$ linear or branched alkyl, a $C_6$-$C_{10}$ aryl, alkylaryl or arylalkyl, or a $C_5$-$C_6$ alicyclic group, a compound represented by the following formula G:

[Formula 7]

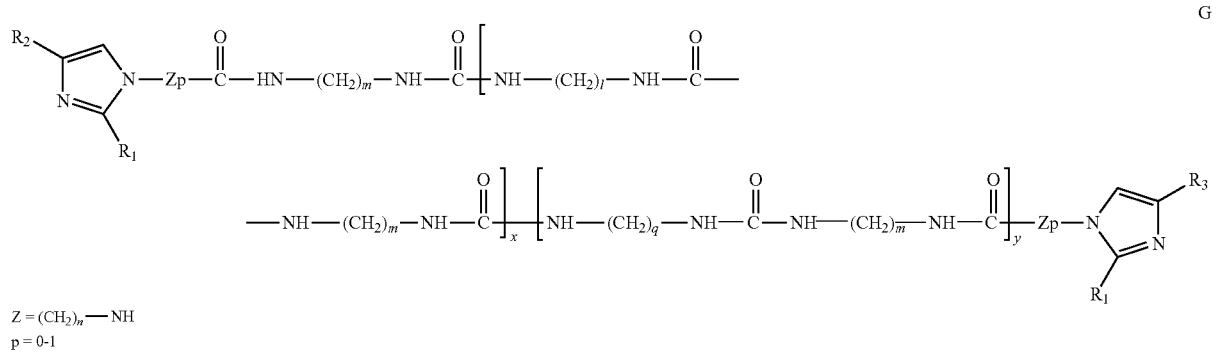

wherein x is 0 to 10; y is 0 to 10; l is 2 to 10; m is 2-8; n is 3 to 8; q is 2 to 10; $R_1$ and $R_2$ each independently represent hydrogen, a $C_1$-$C_{20}$ linear or branched alkyl, a $C_6$-$C_{10}$ aryl, alkylaryl or arylalkyl, or a $C_5$-$C_6$ alicyclic group, and a compound represented by the following formula H:

[Formula 8]

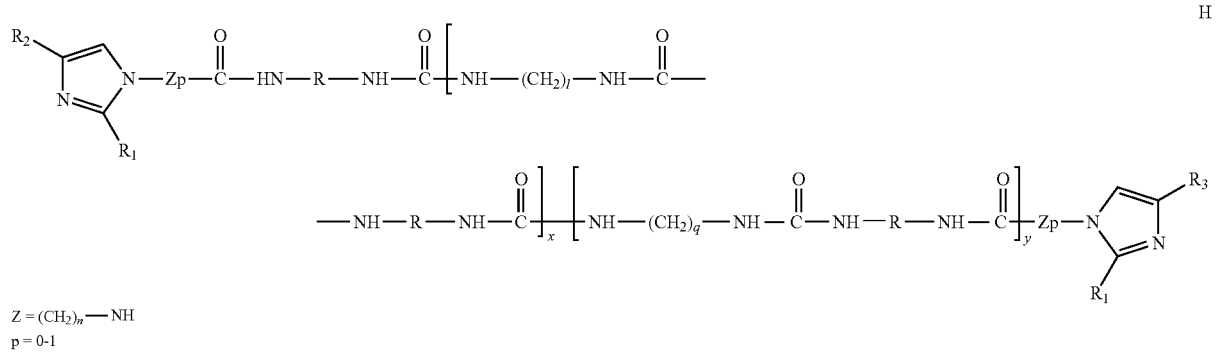

wherein x is 0 to 10; y is 0 to 1; l is 2 to 10; n is 3 to 8; q is 2 to 10; R is $(CH_2)_m$ (m is 2-8) or a polyvalent residue of a polymethylene poly(phenylisocyanate) having an isocyanate functionality of 2.1 to 3.5; and $R_1$ and $R_2$ each independently represent hydrogen, $C_1$-$C_{20}$ linear or branched alkyl, a $C_6$-$C_{10}$ aryl, alkylaryl or arylalkyl, or a $C_5$-$C_6$ alicyclic group.

In the above formulas E, F, G and H, R is preferably a $C_3$-$C_8$ alkanediyl. R is preferably a polyvalent residue of a polymethylene poly(phenylisocyanate) having an isocyanate functionality of 2.1 to 3.5 obtained by reacting an isocyanate functional group with a nitrogen atom of an imidazole in order to give an urea functional group.

An imidazole-isocyanate adduct including 1-(aminoalkyl)imidazole-isocyanate adduct, particularly 1-(3-aminopropyl)imidazole-isocyanate adduct is prepared by a reaction reported in literatures known to those skilled in the art, for example, U.S. Pat. No. 4,797,455, or by reacting a suitable imidazole with a suitable polyisocyanate such as a polymethylene diisocyanate or a polymethylene poly(phenylisocyanate) in a polar solvent such as acetonitrile. Imidazole and isocyanate suitably used in producing an adduct, are commercially available. Imidazole and isocyanate can be obtained from Sigma Aldrich.

Examples of the imidazole-isocyanate adduct suitable used in the present invention include adducts of isocyanates such as tetramethylene diisocyanate, pentamethylene diisocyanate, hexamethylene diisocyanate, octamethylene diisocyanate and a polymethylene poly(phenylisocyanate), and imidazoles such as imidazole, 2-ethylimidazole, 2-methylimidazole, 2-propylimidazole, 2-undecylimidazole, 2-phenylimidazole, 2-isopropylimidazole, 2-ethyl-4-methylimidazole and 2-phenyl-4-methylimidazole) and 1-(aminoalkyl)imidazoles such as 2-methyl-1-(3-aminopropyl)imidazole, 2-ethyl-1-(3-aminopropyl)imidazole, 2-phenyl-1-(3-aminopropyl)imidazole and 2-ethyl-4-methyl-1-(3-aminopropyl)imidazole. Preferable examples of the imidazole-isocyanate adduct include an imidazole and 2-ethyl-4-methylimidazole-hexamethylene diisocyanate and polymethylene poly(phenylisocyanate) adduct, a 1-(3-aminopropyl)imidazole-hexamethylene diisocyanate adduct and a 1-(3-aminopropyl)imidazole-polymethylene poly(phenylisocyanate) adduct.

Particularly preferable examples of the imidazole-isocyanate adduct include a 1-(3-aminopropyl)imidazole-hexamethylene diisocyanate adduct, a 1-(3-aminopropyl)imidazole-polymethylene poly(phenylisocyanate) adduct, a 1-(3-aminopropyl)imidazole-phenyl isocyanate adduct, a 1-(3-aminopropyl)imidazole-cyclohexylisocyanate adduct, a 1-(3-aminopropyl)imidazole toluene diisocyanate adduct and a 2-ethyl-4-methylimidazole-hexamethylene diisocyanate adduct.

The imidazole-isocyanate adduct used in the present invention preferably has a weight average molecular weight of 300 to 10,000 and particularly preferably 500 to 5,000. If the weight average molecular weight is less than 300, tack-free performance sometimes deteriorate, humidity resistance of a coating film after light exposure deteriorates, the thickness of the film reduces during development and that resolution sometimes significantly decreases. If the weight average molecular weight exceeds 10,000, developing significantly deteriorates and storage stability often deteriorates.

The content of the imidazole-isocyanate adduct of the present invention relative based on (C) a thermosetting resin (100 parts by mass) is preferably 0.1 to 50 parts by mass, further preferably 0.5 to 40 parts by mass and particularly preferably 0.5 to 10 parts by mass. Note that the content of the adduct within the range of 0.5 to 2 parts by mass is also preferable since the adduct efficiently functions as a curing catalyst. If the content of the imidazole-isocyanate adduct is less than the lower limit, excellent adhesiveness cannot be obtained. In contrast, if the content exceeds the upper limit, an excellent insulating property cannot be obtained. If the adduct is used in a large amount, it is considered that the adduct not only functions as a catalyst but also reacts with (C) a thermosetting resin and (B) a carboxyl group-containing resin, etc.

[(B) Carboxyl Group-containing Resin]

As the carboxyl group-containing resin, various carboxyl group-containing resins (having a carboxyl group in its molecule) known in the art can be used. In particular, a carboxyl group-containing photosensitive resin having an ethylenically unsaturated double bond in its molecule is preferable in view of photo-curing property and resolution. The ethylenically unsaturated double bond is preferably derived from acrylic acid, methacrylic acid or a derivative thereof.

Specific examples of the carboxyl group-containing resin include the following compounds (which may be either an oligomer or a polymer).

(1) A carboxyl group-containing photosensitive resin, which is obtained by a process including the steps of reacting a compound having a plurality of phenolic hydroxy groups in its molecule with an alkylene oxide such as ethylene oxide and propylene oxide to obtain a first reaction product; reacting the first reaction product with an unsaturated group-containing monocarboxylic acid to obtain a second reaction product; and reacting a polybasic acid anhydride with the second reaction product.

(2) A carboxyl group-containing photosensitive resin, which is obtained by a process including the steps of reacting a (meth)acrylic acid with a bifunctional or a polyfunctional (having more than two functional groups) epoxy resin (solid) which will be described later; and adding a dibasic anhydride to hydroxyl groups present in a side chain.

(3) A carboxyl group-containing photosensitive resin, which is obtained by a process including the steps of further epoxylating the hydroxyl group of a bifunctional (solid) epoxy resin (described later) with epichlorohydrin to obtain a polyfunctional epoxy resin; reacting the polyfunctional epoxy resin with a (meth)acrylic acid; and adding a dibasic anhydride to the resultant hydroxyl groups.

(4) A carboxyl group-containing photosensitive resin obtained by a process including the steps of reacting a compound having a plurality of phenolic hydroxy groups in its molecule with a cyclic carbonate compound such as ethylene carbonate and propylene carbonate to obtain a first reaction product; reacting the first reaction product with an unsaturated group-containing monocarboxylic acid to obtain a second reaction product; and reacting a polybasic acid anhydride to the second reaction product.

(5) A carboxyl group-containing photosensitive urethane resin, which is obtained by a polyaddition reaction among a diisocyanate; a (meth)acrylate of a bifunctional epoxy resin (such as a bisphenol A epoxy resin, a hydrogenated bisphenol A epoxy resin, a bisphenol F epoxy resin, a bisphenol S epoxy resin, a bixylenole epoxy resin, a biphenol epoxy resin) or a partially modified acid anhydride thereof; a carboxyl group-containing dialcohol compound; and a diol compound.

(6) A carboxyl group-containing non-photosensitive resin, which is obtained by copolymerization of a unsaturated carboxylic acid such as a (meth)acrylic acid with an unsaturated group-containing compound such as styrene, α-methylstyrene, a lower alkyl(meth)acrylate and isobutylene.

(7) A carboxyl group-containing non-photosensitive urethane resin, which is obtained by a polyaddition reaction among a diisocyanate (such as an aliphatic diisocyanate, a branched aliphatic diisocyanate, an alicyclic diisocyanate, an aromatic diisocyanate); a carboxyl group-containing dialcohol compound (such as dimethylolpropionic acid, dimethylolbutanoic acid); and a diol compound (such as a polycarbonate polyol, a polyether polyol, a polyester polyol, a polyolefinic polyol, an acrylic polyol, a bisphenol A alkylene oxide adduct diol and a compound having a phenolic hydroxyl group and an alcoholicity hydroxyl group).

(8) A carboxyl group-containing resin, which is obtained by a process including the steps of reacting a bifunctional oxetane resin (which are described later) with a dicarboxylic acid such as adipic acid, phthalic acid and hexahydrophthalic acid; and adding, to the resultant primary hydroxyl group, a dibasic anhydride (such as phthalic anhydride, tetrahydrophthalic anhydride and hexahydrophthalic anhydride).

(9) A carboxyl group-containing photosensitive urethane resin terminated with a (meth)acryl group, which is obtained by, during the synthesis of the resin (5) or (7) as mentioned previously, adding a compound having one hydroxyl group and at least one (meth)acryloyl group in its molecule such as a hydroxyalkyl(meth)acrylate to the synthesis system

(10) A carboxyl group-containing photosensitive urethane resin terminated with a (meth)acryl group, which is obtained by, during the synthesis of the resin (5) or (7) as mentioned previously, adding a compound having a single isocyanate group and at least one (meth)acryloyl group in its molecule such as a compound obtained by a reaction of isophorone diisocyanate and pentaerythritol triacrylate in equivalent moles, to the resin system.

(11) A carboxyl group-containing photosensitive resin, which is obtained by further adding a compound having a single epoxy group and at least one (meth)acryloyl group in its molecule to each of the resins (1) to (10) as mentioned previously.

In the specification, "(meth)acrylate" is a general term collectively referring to an acrylate and a methacrylate and a mixture of these. The same shall apply to other analogous expressions.

Since the carboxyl group-containing resins as mentioned above each have many carboxyl groups at a side chain of a backbone polymer (polymer main chain), development with a diluted aqueous alkali solution can be made.

Furthermore, the carboxyl group-containing resins each preferably have an acid value in the range of 40 to 200 mg KOH/g and further preferably in the range of 45 to 120 mg KOH/g. If the acid value of a carboxyl group-containing resin is less than 40 mg KOH/g, the resin becomes difficult to make development with alkali. In contrast, if the acid value exceeds 200 mg KOH/g, a light exposed portion is excessively dissolved with a developer, with the result that a line becomes thin more than required, and as the case may be, a light exposed portion and a non-light exposed portion are undistinguishably dissolved and removed with a developer, with the result that a normal resist pattern cannot be obtained. Thus, the acid value in excess of 200 mg KOH/g is not preferred.

Furthermore, although the weight average molecular weight of each of the carboxyl group-containing resins varies depending upon the skeleton of the resin, the weight average molecular weight generally preferably falls within the range of 2,000 to 150,000, further preferably within the range of 5,000 to 100,000. If the weight average molecular weight is less than 2,000, tack-free performance often deteriorates; and humidity resistance of a coating film after light exposure deteriorates, with the result that the thickness of the film reduces during development and resolution significantly decreases in some cases. In contrast, if the weight average molecular weight exceeds 150,000, development property deteriorates in some cases and storage stability deteriorates in other cases.

The content of the carboxyl group-containing resin falls appropriately within the range of 20 to 60 mass % and preferably within the range of 30 to 60 mass % based on the total composition. If the content of a carboxyl group-containing resin is less than the above range, the strength of a coating film decreases. Thus, the content less than the above range is not preferred. In contrast, if the content is larger than the above range, the viscosity of the composition increases and coating properties decrease. Thus, the content more than the above range is not preferred.

The carboxyl group-containing resin is not limited to those described above, and carboxyl group-containing resins known in the art can be used singly or as a mixture thereof. Of the carboxyl group-containing resins mentioned above, a resin having an aromatic ring is preferable since the resin has a high refractive index and shows excellent resolution. A resin having a novolak structure is further preferable since the resin shows not only excellent resolution but also PCT (pressure cooker test) resistance and crack resistance. Of them, carboxyl group-containing photosensitive resins (1) and (2) are preferable since they can provide solder resists showing not only satisfactory PCT resistance and other properties but also excellent resolution.

[(C) Thermosetting Resin]

The curable resin composition of the present invention contains (C) a thermosetting resin. If a thermosetting resin is added, it is expected to improve heat resistance. Examples of the thermosetting resin used in the present invention include amino resins such as a melamine resin, a benzoguanamine resin, a melamine derivative and a benzoguanamine derivative; and thermosetting resins known in the art such as a blocked isocyanate compound, a cyclocarbonate compound, a polyfunctional epoxy compound, a polyfunctional oxetane compound, an episulphide resin, bismaleimide and carbodiimide resin. In particular, a thermosetting resin having at least one kind of a plurality of cyclic ether groups and a plurality of cyclic thioether groups (hereinafter simply referred to as a cyclic (thio)ether group) in its molecule is preferred.

A thermosetting component having a plurality of cyclic (thio)ether groups in its molecule refers to a compound having any one or two kinds of 3-, 4- and 5-membered cyclic (thio)ether groups in its molecule and having plurally the kinds in its molecule. Examples thereof include a compound having a plurality of epoxy groups in its molecule, i.e., a polyfunctional epoxy compound; a compound having a plurality of oxetanyl groups in its molecule, i.e., a polyfunctional oxetane compound; and a compound having a plurality of thioether groups in its molecule, i.e., an episulphide resin. Of them, a polyfunctional epoxy compound, i.e., an epoxy resin, is preferred.

Examples of the polyfunctional epoxy compound include, although not limited to, epoxylated vegetable oils such as Adeka Sizer-O-130P, Adeka Sizer-O-180A, Adeka Sizer-D-32 and Adeka Sizer-D-55 (manufactured by ADEKA CORP.); bisphenol A epoxy resins under trade names of e.g., jER 828, jER 834, jER 1001 and jER 1004 (manufactured by Mitsubishi Chemical Corporation), EHPE 3150 (manufactured by Daicel Chemical Industries, Ltd.), Epiclon 840, Epiclon 850, Epiclon 1050 and Epiclon 2055 (manufactured by DIC Corporation), Epotohto YD-011, YD-013, YD-127 and YD-128 (manufactured by Tohto Kasei Co., Ltd.) and D.E.R. 317, D.E.R. 331, D.E.R. 661 and D.E.R. 664 (manufactured by Dow Chemical Company), Sumiepoxy ESA-011, ESA-014, ELA-115 and ELA-128 (manufactured by Sumitomo Chemical Co., Ltd.) and A.E.R. 330, A.E.R. 331, A.E.R. 661 and A.E.R. 664 (manufactured by Asahi Kasei Corporation); YDC-1312, a hydroquinone epoxy resin, YSLV-80XY bisphenol epoxy resin and YSLV-120TE thioether epoxy resin (all are manufactured by Tohto Kasei Co., Ltd.); brominated epoxy resins under the trade names of e.g., jERYL903 (manufactured by Mitsubishi Chemical Corporation), Epiclon 152 and Epiclon 165 (manufactured by DIC Corporation), Epotohto YDB-400 and YDB-500 (manufactured by Tohto Kasei Co., Ltd.), D.E.R. 542 (manufactured by Dow Chemical Company), Sumiepoxy ESB-400 and ESB-700 (manufactured by Sumitomo Chemical Co., Ltd.) and A.E.R. 711 and A.E.R. 714 (manufactured by Asahi Kasei Corporation); novolak epoxy resins under the trade names of e.g., jER 152 and jER 154 (manufactured by Mitsubishi Chemical Corporation), D.E.N. 431, D.E.N. 438 (manufactured by Dow Chemical Company), Epiclon N-730, Epiclon N-770 and Epiclon N-865 (manufactured by DIC Corporation), Epotohto YDCN-701 and YDCN-704 (manufactured by Tohto Kasei Co., Ltd.), EPPN-201, EOCN-1025, EOCN-1020, EOCN-104S and RE-306 (manufactured by Nippon Kayaku Co., Ltd.), Sumiepoxy ESCN-195X and ESCN-220 (manufactured by Sumitomo Chemical Co., Ltd.) and A.E.R. ECN-235 and ECN-299 (manufactured by Asahi Kasei Corporation; biphenol novolak epoxy resins such as NC-3000 and NC-3100 (manufactured by Nippon Kayaku Co., Ltd.); bisphenol F epoxy resins such as Epiclon 830 (manufactured by DIC Corporation), jER 807 (manufactured by Mitsubishi Chemical Corporation) and Epotohto YDF-170, YDF-175 and YDF-2004 (manufactured by Tohto Kasei Co., Ltd.); hydrogenated bisphenol A epoxy resins under the trade names of e.g., Epotohto ST-2004, ST-2007 and ST-3000 (manufactured by Tohto Kasei Co., Ltd.; glycidyl amine epoxy resins under the trade names of e.g., jER 604 (manufactured by Mitsubishi Chemical Corporation), Epotohto YH-434 (manufactured by Tohto Kasei Co., Ltd.) and Sumiepoxy ELM-120 (manufactured by Sumitomo Chemical Co., Ltd.); hydantoin epoxy resins; alicyclic epoxy resins under the trade names of e.g., celloxide 2021 and CY179 (manufactured by Daicel Chemical Industries, Ltd.); trihydroxyphenylmethane epoxy resins under the trade names of e.g., YL-933 (manufactured by Mitsubishi Chemical Corporation), and T.E.N., EPPN-501 and EPPN-502 (manufactured by Dow Chemical Company); bixylenol or biphenol epoxy resins or mixtures thereof under the trade names of e.g., YL-6056, YX-4000 and YL-6121 (manufactured by Mitsubishi Chemical Corporation); bisphenol S epoxy resins under the trade names of e.g., EBPS-200 (manufactured by Nippon Kayaku Co., Ltd.), EPX-30 (manufactured by ADEKA CORP.) and EXA-1514 (manufactured by DIC Corporation); bisphenol A novolak epoxy resins under trade name of e.g., jER 157S (manufactured by Mitsubishi Chemical Corporation); tetraphenylolethane epoxy resins under the trade names of e.g., jERYL-931 (manufactured by Mitsubishi Chemical Corporation); heterocyclic epoxy resins under the trade names of e.g., TEPIC (manufactured by Nissan Chemical Industries, Ltd.); diglycidylphthalate resins such as Blenmer-DGT (manufactured by NOF Corporation); tetraglycidylxylenoylethane resins such as ZX-1063 (manufactured by Tohto Kasei Co., Ltd.); naphthalene group-containing epoxy resins such as ESN-190 and ESN-360 (manufactured by Nippon Steel Chemical Co., Ltd.) and HP-4032, EXA-4750 and EXA-4700 (manufactured by DIC Corporation); epoxy resins having a dicyclopentadiene skeleton such as HP-7200 and HP-7200H (manufactured by DIC Corporation); epoxy resins of a glycidyl methacrylate copolymer such as CP-50S and CP-50M (manufactured by NOF Corporation); epoxy resins by copolymerization of cyclohexyl maleimide and glycidyl methacrylate; and epoxy modified polybutadiene rubber derivatives (for example, PB-3600 manufactured by Daicel Chemical Industries, Ltd.) and CTBN modified epoxy resins (for example, YR-102 and YR-450 manufactured by Tohto Kasei Co., Ltd.). These epoxy resins can be used alone or in combination of two or more kinds. Of these, a novolak epoxy resin, a bixylenol epoxy resin, a biphenol epoxy resin, a biphenol novolak epoxy resin, a naphthalene epoxy resin or a mixture of these is particularly preferred.

Examples of the polyfunctional oxetane compound include polyfunctional oxetanes such as bis[(3-methyl-3-oxetanylmethoxy)methyl]ether, bis[(3-ethyl-3-oxetanylmethoxy)methyl]ether, 1,4-bis[(3-methyl-3-oxetanylmethoxy)methyl]benzene, 1,4-bis[(3-ethyl-oxetanylmethoxy)methyl]benzene, (3-methyl-3-oxetanyl) methacrylate, (3-ethyl-3-oxetanyl) methacrylate, (3-methyl-3-oxetanyl)methyl methacrylate, (3-ethyl-3-oxetanyl)methyl methacrylate, oligomers or copolymers of these; and etherified compounds each obtained by the reaction between oxetane alcohol and a resin having a hydroxyl group such as a novolak resin, poly (p-hydroxystyrene), cardo-type bisphenol, calixarene, calixresorcinarene or silsesquioxane. Besides these, copolymers each obtained by copolymerization of an unsaturated monomer having an oxetane ring and an alkyl(meth)acrylate can be also included.

Examples of the compound having a plurality of cyclic thioether groups in its molecule include bisphenol A episulphide resin YL7000, manufactured by Mitsubishi Chemical Corporation. In addition, episulphide resins obtained by replacing an oxygen atom of an epoxy group of a novolak epoxy resin with a sulfur atom in accordance with the similar synthetic method as above can be used.

The content of the thermosetting resin (particularly, a thermosetting resin having a plurality of cyclic ether groups in its molecule) is preferably 0.6 to 2.5 equivalents per one equivalent of the carboxyl group of the carboxyl group-containing resin. If the content is less than 0.6, a carboxyl group remains in a solder resist, with the result that heat resistance, alkali resistance and electric insulating characteristics deteriorate. In contrast, if the content exceeds 2.5 equivalents, a low molecular weight cyclic ether group remains in a dry coating film, with the result that strength of a coating film decreases. More preferably, the content of a thermosetting resin is 0.8 to 2.0 equivalents.

Examples of other thermosetting resins include amino resins such as a melamine derivative and a benzoguanamine derivative. Specific examples thereof include a methylol melamine compound, a methylol benzoguanamine compound, a methylol glycoluril compound and a methylol urea compound. In addition, an alkoxymethylated melamine compound, an alkoxymethylated benzoguanamine compound, an alkoxymethylated glycoluril compound and an alkoxymethylated urea compound are included which are obtained by converting each of the methylol groups of a methylol melamine compound, a methylol benzoguanamine compound, a methylol glycoluril compound and a methylol urea compound, to an alkoxymethyl group. Examples of the alkoxymethyl group include, although not particularly limited to, a methoxymethyl group, an ethoxymethyl group, a propoxymethyl group and a butoxymethyl group. In particular, a melamine derivative having a formalin concentration of 0.2% or less is preferable since it is safe to the human body and environment.

Examples of commercially available products of these thermosetting components include CYMEL 300, CYMEL 301, CYMEL 303, CYMEL 370, CYMEL 325, CYMEL 327, CYMEL 701, CYMEL 266, CYMEL 267, CYMEL 238, CYMEL 1141, CYMEL 272, CYMEL 202, CYMEL 1156, CYMEL 1158, CYMEL 1123, CYMEL 1170, CYMEL 1174, CYMEL UFR65 and CYMEL 300 (all are manufactured by Mitsui Cyanamid Co.); and NIKALAC Mx-750, NIKALAC Mx-032, NIKALAC Mx-270, NIKALAC Mx-280, NIKALAC Mx-290, NIKALAC Mx-706, NIKALAC Mx-708, NIKALAC Mx-40, NIKALAC Mx-31, NIKALAC Ms-11, NIKALAC Mw-30, NIKALAC Mw-30HM, NIKALAC Mw-390, NIKALAC Mw-100LM and NIKALAC Mw-750LM, (all are manufactured by Sanwa Chemical Co. Ltd.). These thermosetting components can be used alone or in combination of two or more kinds.

To the curable resin composition of the present invention, a compound having a plurality of isocyanate groups in its molecule and a compound having a plurality of blocked isocyanate groups in its molecule except (A) an imidazole-isocyanate adduct of the present invention, can be added. As examples of the compound having a plurality of isocyanate groups in its molecule or a compound having a plurality of blocked isocyanate groups in its molecule, a polyisocyanate compound or a blocked isocyanate compound can be mentioned. The blocked isocyanate group refers to an isocyanate group protected through a reaction with a blocking agent and temporarily inactivated. If the blocked isocyanate group is heated to a predetermined temperature, the blocking agent dissociates from it and an isocyanate group is generated. If the polyisocyanate compound or blocked isocyanate compound is added, curability and toughness of the cured material are improved.

As the polyisocyanate compound, for example, an aromatic polyisocyanate, an aliphatic polyisocyanate or a cyclic polyisocyanate is used.

Specific examples of the aromatic polyisocyanate include 4,4'-diphenylmethane diisocyanate, 2,4-tolylene diisocyanate, 2,6-tolylene diisocyanate, 1,5-naphthalene-diisocyanate, o-xylylene diisocyanate, m-xylylene diisocyanate and 2,4-tolylene dimer.

Specific examples of the aliphatic polyisocyanate include tetramethylene diisocyanate, hexamethylene diisocyanate, methylene diisocyanate, trimethyl hexamethylene diisocyanate, 4,4-methylenebis(cyclohexylisocyanate) and isophorone diisocyanate.

Specific examples of the alicyclic polyisocyanate include bicycloheptane triisocyanates. Further, adducts, burettes and isocyanulates of the isocyanate compounds mentioned above can be mentioned.

As the blocked isocyanate compound, a reaction product obtained by an addition reaction of an isocyanate compound and an isocyanate blocking agent. Examples of the isocyanate compound that can react with a blocking agent include the polyisocyanate compounds mentioned above.

Examples of the isocyanate blocking agent include, phenolic blocking agents such as phenol, cresol, xylenol, chlorophenol and ethylphenol; lactam blocking agents such as ε-caprolactam, δ-valerolactam, γ-butyrolactam and β-propiolactam; active methylene blocking agents such as ethyl acetoacetate and acetylacetone; alcohol blocking agents such as methanol, ethanol, propanol, butanol, amyl alcohol, ethylene glycol monomethyl ether, ethylene glycol monoethyl ether, ethylene glycol monobutyl ether, diethylene glycol monomethyl ether, propylene glycol monomethyl ether, benzyl ether, methyl glycolate, butyl glycolate, diacetone alcohol, methyl lactate and ethyl lactate; oxime blocking agents such as formaldehyde oxime, acetaldehyde oxime, acetone oxime, methylethyl ketone oxime, diacetyl monoxime and cyclohexane oxime; mercaptan blocking agents such as butyl mercaptan, hexyl mercaptan, t-butyl mercaptan, thiophenol, methylthiophenol and ethylthiophenol; acid amide blocking agents such as acetic acid amide and benzamide; imide blocking agents such as succinic acid imide and maleic acid imide; amine blocking agents such as xylidine, aniline, butyl amine and dibutyl amine; imidazole blocking agents such as imidazole and 2-ethylimidazole; and imine blocking agents such as methylene imine and propylene imine.

A blocked isocyanate compound can be a commercially available compound. Examples thereof include Sumidur BL-3175, BL-4165, BL-1100 and BL-1265, Desmodur TPLS-2957, TPLS-2062, TPLS-2078 and TPLS-2117, Desmotherm 2170 and Desmotherm 2265 (all are manufactured by Sumitomo Bayer Urethane Co., Ltd.), CORONATE 2512, CORONATE 2513 and CORONATE 2520 (all are manufactured by Nippon Polyurethane Industries Co., Ltd.), B-830, B-815, B-846, B-870, B-874 and B-882 (all are manufactured by Mitsui Takeda Chemical, Inc.) and TPA-B80E, 17B-60PX and E402-B80T (all are manufactured by Asahi Kasei Chemicals Corporation). Sumidur BL-3175 and BL-4265 are obtained by using methylethyl oxime as a blocking agent. Compounds having a plurality of isocyanate groups or blocked isocyanate groups in its molecule as mentioned above can be used alone or in combination of two or more kinds.

The content of a compound having a plurality of isocyanate groups or blocked isocyanate groups in its molecule is preferably 0.1 to 50 mass % based on the total composition. If the content is less than 0.1 mass %, sufficient toughness of the resultant coating film cannot be obtained. In contrast, if the content exceeds 50 mass %, storage stability deteriorates. The content is more preferably 1 to 30 mass %.

[(D) Photopolymerization Initiator]

The curable resin composition of the present invention preferably contains a photopolymerization initiator. As a photopolymerization initiator, at least one selected from the group consisting of an oxime ester photopolymerization initiator having an oxime ester group, an alkylphenone photopolymerization initiator, an α-amino acetophenone photopolymerization initiator, an acylphosphine oxide photopolymerization initiator and a titanocene photopolymerization initiator can be preferably used.

Particularly, an oxime ester photopolymerization initiator as mentioned above is preferable because the addition amount thereof is decreased and outgas is suppressed, with the result that PCT resistance and crack resistance are effectively obtained.

Commercially available products of an oxime ester photopolymerization initiator include CGI-325, Irgacure-OXE01 and Irgacure-OXE02 (manufactured by BASF Japan Ltd.); and N-1919 and NCI-831 (manufactured by Adeka Corp.). In addition, a photopolymerization initiator having two oxime ester groups in its molecule is preferably used. More specifically, an oxime ester compound having a carbazole structure which is represented by the following general formula may be mentioned.

[Formula 9]

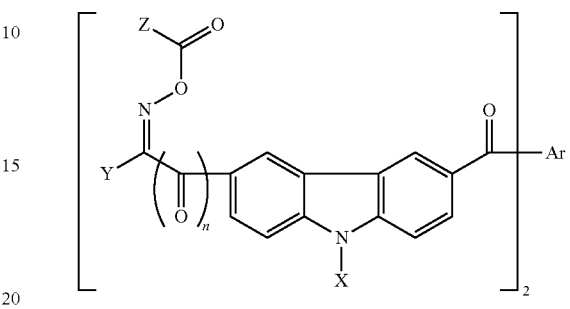

wherein X is hydrogen atom, a $C_{1-17}$ alkyl group, a $C_{1-8}$ alkoxy group, a phenyl group, a phenyl group (substituted with a $C_{1-17}$ alkyl group, a $C_{1-8}$ alkoxy group, an amino group, or an alkylamino group or dialkylamino group having a $C_{1-8}$ alkyl group), a naphthyl group (substituted with a $C_{1-17}$ alkyl group, a $C_{1-8}$ alkoxy group, an amino group, or an alkylamino group or dialkylamino group having a $C_{1-8}$ alkyl group); Y and Z each independently a hydrogen atom, a $C_{1-17}$ alkyl group, a $C_{1-8}$ alkoxy group, a halogen group, a phenyl group, a phenyl group (substituted with a $C_{1-17}$ alkyl group, a $C_{1-8}$ alkoxy group, an amino group, or an alkylamino group or dialkylamino group having a $C_{1-8}$ alkyl group), a naphthyl group (substituted with a $C_{1-17}$ alkyl group, a $C_{1-8}$ alkoxy group, an amino group, or an alkylamino group or a dialkylamino group having $C_{1-8}$ alkyl group), an anthryl group, a pyridyl group, a benzofuryl group or a benzothienyl group; Ar represents a bond, $C_{1-10}$ alkylene, vinylene, phenylene, biphenylene, pyridylene, naphthylene, thiophene, anthrylene, thienylene, furylene, 2,5-pyrrolediyl, 4,4'-stilbenediyl or 4,2'-styrenediyl; and n is an integer of 0 or 1.

In the above general formula, it is preferable that X and Y be a methyl group and an ethyl group, respectively; Z is a methyl or phenyl; n is 0; Ar represents a bond or a phenylene, naphthylene, thiophene or thienylene.

As a preferable carbazole oxime ester compound, compounds represented by the following formula can be mentioned.

[Formula 10]

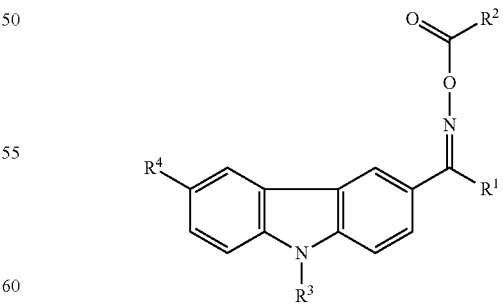

wherein $R^1$ represents a $C_{1-4}$ alkyl group or a phenyl group which may be substituted with a nitro group, a halogen atom or a $C_{1-4}$ alkyl group.

$R^2$ represents a $C_{1-4}$ alkyl group, a $C_{1-4}$ alkoxy group or a phenyl group which may be substituted with a $C_{1-4}$ alkyl group or alkoxy group.

$R^3$ may be connected with an oxygen atom or a sulfur atom and represents a $C_{1-20}$ alkyl group which may be substituted with a phenyl group or a benzyl group which may be substituted with a $C_{1-4}$ alkoxy group.

$R^4$ represents a nitro group or an acyl group represented by X—C(=O)—.

X represents an aryl group that may be substituted with a $C_{1-4}$ alkyl group, a thienyl group, a morpholino group and a thiophenyl group or a structure represented by the following formula:

[Formula 11]

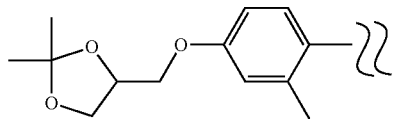

Besides those mentioned above, carbazole oxime ester compounds described in Japanese Patent Laid-Open No. 2004-359639, Japanese Patent Laid-Open No. 2005-097141, Japanese Patent Laid-Open No. 2005-220097, Japanese Patent Laid-Open No. 2006-160634, Japanese Patent Laid-Open No. 2008-094770, National Publication of International Patent Application No. 2008-509967, National Publication of International Patent Application No. 2009-040762 and Japanese Patent Laid-Open No. 2011-80036 may be mentioned.

The content of such an oxime ester photopolymerization initiator is preferably 0.01 to 5 mass % based on the total composition and more preferably 0.25 to 3 mass %.

If the content is specified as 0.01 to 5 mass %, it is possible to obtain a solder resist excellent in photo-curing property and resolution and improved in adhesiveness and PCT resistance and further having excellent chemical resistance such as resistance to non-electrolytic metal plating.

If the content is less than 0.01 mass %, photo-curing property on copper is insufficient. As a result, a solder resist coating film peels off; and, at the same time, coating-film characteristics such as chemical resistance deteriorate. In contrast, if the content exceeds 5 mass %, light absorbance by the surface of a solder resist coating film increases and deep-part curability tends to decrease.

As the alkylphenone photopolymerization initiator, α-hydroxyalkylphenone photopolymerization initiator may be mentioned. Commercially available products thereof include Irgacure-184, Darocur-1173, Irgacure-2959 and Irgacure-127 manufactured by BASF Japan Ltd.

Specific examples of the α-amino acetophenone photopolymerization initiator include 2-methyl-1-[4-(methylthio)phenyl]-2-morpholinopropanone-1,2-benzil-2-dimethylamino-1-(4-morpholinophenyl)-butan-1-on, 2-(dimethylamino)-2-[(4-methylphenyl)methyl]-1-[4-(4-morpholinyl)phenyl]-1-butanone and N,N-dimethylamino acetophenone. Examples of commercially available products thereof include Irgacure-907, Irgacure-369 and Irgacure-379 manufactured by BASF Japan Ltd.

Specific examples of the acylphosphineoxide photopolymerization initiator include 2,4,6-trimethylbenzoyl-diphenylphosphine-oxide, bis(2,4,6-trimethylbenzoyl)-phenylphosphine-oxide and bis(2,6-dimethoxybenzoyl)-2,4,4-trimethyl-pentylphosphine-oxide. Examples of commercially available products thereof include LUCIRIN TPO manufactured by BASF and Irgacure-819 manufactured by BASF Japan Ltd.

The content of each of these α-amino acetophenone photopolymerization initiator and acylphosphineoxide photopolymerization initiator is preferably 0.1 to 25 mass % based on the total composition and more preferably 1 to 20 mass %.

If the content is within the range of 0.1 to 25 mass %, it is possible to obtain a solder resist excellent in photo-curing property and resolution and improved in adhesiveness and PCT resistance and further having excellent chemical resistance such as resistance to non-electrolytic metal plating.

In contrast, if the content is less than 0.1 mass %, photo-curing property on copper is insufficient similarly to the above. As a result, a solder resist peels off and coating-film characteristics such as chemical resistance deteriorate. In contrast, if the content exceeds 25 mass %, outgas cannot be suppressed, light absorbance by the surface of solder resist increases and deep-part curability tends to decrease.

As a photopolymerization initiator, Irgacure 389 (manufactured by BASF Japan Ltd.) is also preferably used. The content of Irgacure 389 is preferably 0.1 to 20 mass % based on the total composition and further preferably 1 to 15 mass %.

A titanocene photopolymerization initiator such as Irgacure 784 can be preferably used. The content of the titanocene photopolymerization initiator is preferably 0.01 to 5 mass % based on the total composition and further preferably 0.01 to 3 mass %.

If the content of each of these photopolymerization initiators falls within a preferable range, it is possible to obtain a solder resist excellent in photo-curing property and resolution and improved in adhesiveness and PCT resistance and further having excellent chemical resistance such as resistance to non-electrolytic metal plating.

In contrast, if the content is less than a preferable content, photo-curing property on copper is insufficient. As a result, a solder resist peels off and coating film characteristics such as chemical resistance deteriorate. In contrast, if the content exceeds a preferable content, outgas cannot be suppressed, light absorbance by the surface of solder resist increases and deep-part curability tends to decrease.

To the photosensitive curable resin composition, a photopolymerization initiator aid and a sensitizer can be added besides a photopolymerization initiator. Examples of the photopolymerization initiator, photopolymerization initiator aid and sensitizer which can be preferably used in a curable resin composition include a benzoin compound, an acetophenone compound, an anthraquinone compound, a thioxanthone compound, a ketal compound, a benzophenone compound, a tertiary amine compound and a xanthone compound.

Examples of the benzoin compound include benzoin, benzoin methyl ether, benzoin ethyl ether and benzoin iso-propyl ether.

Examples of the acetophenone compound include acetophenone, 2,2-dimethoxy-2-phenylacetophenone, 2,2-diethoxy-2-phenylacetophenone and 1,1-dichloroacetophenone.

Examples of the anthraquinone compound include 2-methylanthraquinone, 2-ethylanthraquinone, 2-t-butylanthraquinone and 1-chloroanthraquinone.

Examples of the thioxanthone compound include 2,4-dimethylthioxanthone, 2,4-diethylthioxanthone, 2-chlorothioxanthone and 2,4-diisopropylthioxanthone.

Examples of the ketal compound include acetophenone dimethyl ketal and benzyl dimethyl ketal.

Examples of the benzophenone compound include benzophenone, 4-benzoyldiphenyl sulfide, 4-benzoyl-4'-methyldiphenyl sulfide, 4-benzoyl-4'-ethyldiphenyl sulfide and 4-benzoyl-4'-propyldiphenyl sulfide.

Examples of the tertiary amine compound include an ethanolamine compound and a compound having a dialkylamino benzene structure. Examples of commercially available products of the compound having a dialkylamino benzene structure include dialkylaminobenzophenones such as 4,4'-dimethylamino-benzophenone (Nisso Cure MABP, manufactured by Nippon Soda Co., Ltd.) and 4,4'-diethylamino-benzophenone (EAB, manufactured by Hodogaya Chemical Co. Ltd.); dialkylamino group-containing coumarin compounds such as 7-(diethylamino)-4-methyl-2H-1-benzopyran-2-on (7-(diethylamino)-4-methylcoumalins); ethyl 4-dimethylaminobenzoate (Kaya Cure EPA, manufactured by Nippon Kayaku Co., Ltd.), ethyl 2-dimethylaminobenzoate (Quantacure DMB, manufactured by International Bio-Synthetics, Ltd.), (n-butoxy)ethyl 4-dimethylaminobenzoate (Quantacure BEA, manufactured by International Bio-Synthetics, Ltd.), isoamylethyl p-dimethylaminobenzoate (Kaya Cure DMBI, manufactured by Nippon Kayaku Co., Ltd.), 2-ethylhexyl 4-dimethylaminobenzoate (Esolol 507, manufactured by Van Dyk) and 4,4'-diethylamino-benzophenone (EAB manufactured by Hodogaya Chemical Co. Ltd.).

Of these, a thioxanthone compound and a tertiary amine compound are preferred. Particularly, it is preferable to contain a thioxanthone compound in view of deep-part curability. In particular, a thioxanthone compound such as 2,4-dimethylthioxanthone, 2,4-diethylthioxanthone and 2-chlorothioxanthone and 2,4-diisopropylthioxanthone is preferably contained.

The content of such a thioxanthone compound is preferably 20 mass % or less based on the total composition. If the content of a thioxanthone compound exceeds 20 mass %, the curability of a thick film deteriorates and cost of a product may rise. The content is more preferably 10 mass % or less.

As the tertiary amine compound, a compound having a dialkylamino benzene structure is preferred. Of them, a dialkylamino-benzophenone compound, and a dialkylamino group-containing coumarin compound and keto coumarin compound which have a maximum absorption wavelength within the range of 350 to 450 nm are particularly preferable.

As the dialkyl aminobenzophenone compound, 4,4'-diethylamino-benzophenone is preferable owing to low toxicity. A dialkylamino group-containing coumarin compound, since it has a maximum absorption wavelength within the UV ray range of 350 to 410 nm and is colored less, can provide a color less transparent photosensitive composition. In addition, by the use of a pigment, a colored solder resist in which the color of the pigment itself is reflected can be obtained. Particularly, 7-(diethylamino)-4-methyl-2H-1-benzopyran-2-on is preferred since it has an excellent effect of sensitization to the laser light within a wavelength range of 400 to 410 nm.

The content of the tertiary amine compound is preferably 0.01 to 20 mass % based on the total composition. If the content of the tertiary amine compound is less than 0.01 mass %, the sensitization effect tends to be insufficient. In contrast, if the content exceeds 20 mass %, light absorption by a tertiary amine compound on the surface of a dry solder resist increases and deep-part curability tends to decrease. The content is more preferably 0.5 to 10 mass %.

These photopolymerization initiator, photopolymerization initiator aid and sensitizer can be used alone or as a mixture of two or more kinds.

The total content of the photopolymerization initiator, photopolymerization initiator aid and sensitizer is preferably 30 mass % or less based on the total composition. If the content exceeds 30 mass %, light is absorbed by these and hence deep-part curability tends to decrease.

[(E) Reactive Diluent]

The curable resin composition preferably contains a reactive diluent. As the reactive diluent, it is preferable that a compound having an ethylenically unsaturated group in its molecule is used and blended. The compound having an ethylenically unsaturated group in its molecule is cured by irradiation of an active energy beam, whereby the compound insolubilizes or helps to insolubilize the photosensitive resin composition of the present invention to an aqueous alkali solution. As the compound, compounds known and routinely used in the art, such as a polyester(meth)acrylate, a polyether (meth)acrylate, a urethane(meth)acrylate, a carbonate(meth) acrylate, an epoxy(meth)acrylate and a urethane(meth)acrylate can be used. Specific examples thereof include hydroxyalkyl acrylates such as 2-hydroxyethyl acrylate and 2-hydroxypropyl acrylate; diacrylates of glycol such as ethylene glycol, methoxy tetraethylene glycol, polyethylene glycol and propylene glycol; acrylic amides such as N,N-dimethylacrylamide, N-methylolacrylamide and N,N-dimethylaminopropylacrylamide; aminoalkyl acrylates such as N,N-dimethylaminoethyl acrylate and N,N-dimethylaminopropyl acrylate; polyvalent acrylates of polyhydric alcohols such as hexane diol, trimethylolpropane, pentaerythritol, dipentaerythritol and tris-hydroxyethyl isocyanurate, or of an ethylene oxide adduct, propylene oxide adduct thereof or ε-caprolactone adduct of the above polyhydric alcohols; polyvalent acrylates such as phenoxy acrylate, bisphenol A diacrylate and ethylene oxide adducts or propyleneoxide adducts of these phenols; and polyvalent acrylates of diglycidyl ethers such as glycerin diglycidyl ether, glycerin triglycidyl ether, trimethylolpropane triglycidyl ether and triglycidyl isocyanurate. Besides the aforementioned compounds, at least one of acrylates obtained direct acrylation of polyols such as polyether polyol, polycarbonate diol, a hydroxyl group terminated polybutadiene and a polyester polyol, or acrylates obtained by urethane acrylation of the polyols via diisocyanate and melamine acrylate, and methacrylates corresponding to the aforementioned acrylates can be mentioned.

In addition, an epoxy acrylate resin obtained by reacting acrylic acid with a polyfunctional epoxy resin such as a cresol novolak epoxy resin, and epoxy urethane acrylate compounds obtained by reacting the hydroxyl group of the epoxy acrylate resin with a half-urethane compound obtained by the reaction of a hydroxy acrylate such as pentaerythritol triacrylate and a diisocyanate such as isophorone diisocyanate can be mentioned. These epoxy acrylate resins can improve photo-curing property without deteriorating finger-touch dryness.

Compounds having an ethylenically unsaturated group in its molecule as mentioned above may be used alone or in combination of two or more kinds. Particularly, a compound having 4 to 6 ethylenically unsaturated groups in its molecule is preferable in view of photoreactivity and resolution. When a compound having two ethylenically unsaturated groups in its molecule is used, the linear thermal expansion coefficient of a cured material decreases and frequency of occurrence of peeling during PCT decreases. For the reason, a compound having two ethylenically unsaturated groups in its molecule is preferred.

The content of a compound having an ethylenically unsaturated group in its molecule as mentioned above is preferably 2 to 50 mass % based on the total composition. If the content is less than 2 mass %, photo-curing characteristics deteriorate. In addition, after irradiation with an active energy beam, it is difficult to form a pattern with alkali development. In contrast, if the content exceeds 50 mass %, the solubility to a diluted aqueous alkali solution decreases and the resultant coating film becomes fragile. The content is more preferably 3 to 40 mass %.

[Filler]

The curable resin composition of the present invention preferably contains an inorganic filler. The inorganic filler is used for suppressing cure shrinkage of a cured product of a curable resin composition and improving properties such as adhesiveness and hardness. Examples of the inorganic filler include barium sulfate, barium titanate, amorphous silica, crystalline silica, Neuburg siliceous earth, fused silica, spherical silica, talc, clay, magnesium carbonate, calcium carbonate, aluminium oxide, aluminium hydroxide, silicon nitride and aluminum nitride.

The average particle diameter of the above inorganic filler is preferably 5 μm or less. The content thereof is preferably 75 mass % or less based on the total composition and more preferably 0.1 to 60 mass %. If the content of an inorganic filler exceeds 75 mass %, viscosity of the resultant composition increases, with the result that coating properties decrease and a cured product of the resultant curable resin composition becomes fragile.

[Cyanate Resin]

The curable resin composition of the present invention preferably contains a cyanate resin. The use of a cyanate resin enables the curable resin composition to have high heat resistance, low dielectric loss tangent and low thermal expansion rate. Examples of the cyanate resin that can be used include, although not particularly limited to, a cyanic acid ester monomer having a cyanate group (—O—C≡N) and a prepolymer with which a polyfunctional cyanic acid ester monomer is previously reacted. Specific examples thereof include novolak (e.g., phenol novolak, alkyl phenol novolak) cyanate resins, a dicyclopentadiene cyanate resin, a bisphenol (e.g., bisphenol A, bisphenol F, bisphenol S) cyanate resin and prepolymers obtained by partially replacing each of these with a triazine. In addition, a compound obtained by previously reacting or mixing a polyfunctional cyanic acid ester monomer or prepolymer such as 2,2-bis(4-cyanatephenyl) propane with a polyfunctional maleimide monomer or prepolymer such as bismaleimide in a mass ratio of 95:5 to 5:95 (for example, BT resin, manufactured by Mitsubishi Gas Chemical Company Inc.) can be used. These cyanate resins may be used alone or in combination of two or more kinds.

Specific examples of the cyanate resins include, bifunctional cyanate resins such as bisphenol A dicyanate, polyphenol cyanate (oligo(3-methylene-1,5-phenylenecyanate)), 4,4'-methylenebis(2,6-dimethylphenylcyanate), 4,4'-ethylidenediphenyl dicyanate, 2,2-bis(4-cyanatephenyl)hexafuloropropane, 2,2-bis(4-cyanatephenyl)propane, 1,1-bis(4-cyanatephenyl)methane, bis(4-cyanate-3,5-dimethylphenyl) methane, 1,3-bis(4-cyanatephenyl-1-(methylethylidene)) benzene, bis(4-cyanatephenyl)thioether and bis(4-cyanatephenyl)ethane; polyfunctional cyanate resins derived from phenolic novolak, cresol novolak and a dicyclopentadiene structure-containing phenol resin; and a prepolymer obtained by replacing part of each of these cyanate resins with a triazine.

As a commercially available cyanate resin, more specifically, phenol novolak polyfunctional cyanate resin, PT30 (cyanate equivalent: 124) manufactured by Lonza Japan Ltd. may be mentioned. As commercially available trimeric prepolymer, in which a part or whole of bisphenol A dicyanate is replaced with a triazine, BA230 (cyanate equivalent: 232) manufactured by Lonza Japan Ltd. is mentioned. As a commercially available dicyclopentadiene structure-containing cyanate resin, for example, DT-4000 and DT-7000, (manufactured by Lonza Japan Ltd.) are mentioned.

The content of the cyanate resin is preferably 1 to 50 mass % based on the total composition. If the content exceeds 50 mass %, development property decreases. The content is more preferably 2 to 30 mass %.

To the curable resin composition of the present invention, known additives, more specifically an organic solvent, an elastomer, a mercapto compound, a coloring agent, an antioxidant, a UV absorber, an adhesion accelerant, a polymerization inhibitor, a fine silica powder, a thickening agent such as organic bentonite and montmorillonite, at least one of defoaming agents and leveling agents such as silicone-, fluorine- and polymer-defoaming agents and silicone-, fluorine- and polymer-leveling agents; silane coupling agents such as imidazole, thiazole and triazole coupling agents, a rust preventing agent, flame retardants such as a hypophosphite, a phosphate derivative and a phosphorus compound (e.g., phosphazene) and a block copolymer may be added as optional components.

[Organic Solvent]

In the curable resin composition of the present invention, an organic solvent can be used for synthesizing a carboxyl group-containing resin as mentioned above, preparing a composition or controlling viscosity thereof for applying it to a substrate or a carrier film.

Examples of such an organic solvent include ketones, aromatic hydrocarbons, glycol ethers, glycol ether acetates, esters, alcohols, aliphatic hydrocarbons and petroleum solvents. Specific examples include ketones such as methyl ethyl ketone and cyclohexanone; aromatic hydrocarbons such as toluene, xylene and tetramethyl benzene; glycol ethers such as cellosolve, methyl cellosolve, butyl cellosolve, carbitol, methyl carbitol, butyl carbitol, propylene glycol monomethyl ether, dipropylene glycol monomethyl ether, dipropylene glycol diethyl ether and triethylene glycol monoethyl ether; esters such as ethyl acetate, butyl acetate, dipropylene glycol methyl ether acetate, propylene glycol methyl ether acetate, propylene glycol ethyl ether acetate and propylene glycol butyl ether acetate; alcohols such as ethanol, propanol, ethylene glycol and propylene glycol; aliphatic hydrocarbon such as octane and decane; petroleum solvents such as petroleum ether, petroleum naphtha, hydrogenated petroleum naphtha and solvent naphtha. These organic solvents may be used alone or as a mixture of two or more kinds.

[Elastomer]

To the curable resin composition mentioned above, an elastomer having a functional group can be added. If an elastomer having a functional group is added, it is expected to improve a coating property and strength of a coating film. Examples of trade names of the elastomer having a functional group include R-45HT, Poly bd HTP-9 (all are manufactured by Idemitsu Kosan Co., Ltd.); EPOLEAD PB3600 (manufactured by Daicel Chemical Industries, Ltd.); DENAREX R-45EPT (manufactured by Nagase ChemteX Corporation); and Ricon 130, Ricon 131, Ricon 134, Ricon 142, Ricon 150, Ricon 152, Ricon 153, Ricon 154, Ricon 156, Ricon 157, Ricon 100, Ricon 181, Ricon 184, Ricon 130MA8, Ricon 130MA13, Ricon 130MA20, Ricon 131MA5, Ricon 131MA10, Ricon 131MA17, Ricon 131MA20, Ricon 184MA6 and Ricon 156MA17 (all are manufactured by Sartomer). Polyester elastomers, polyurethane elastomers, polyester polyurethane elastomers, polyamide elastomers, polyester amide elastomers, acrylic elastomers and olefinic elastomers can be used. Furthermore, resins obtained by modifying a part or whole of epoxy groups of each of epoxy resins having different skeletons with a butadiene-acrylonitrile rubber both terminals of which are modified with a carboxylic acid can be used. Moreover, an epoxy-containing polybutadiene elastomer, an acryl-containing polybutadiene elastomer, a hydroxyl group-containing polybutadiene elastomer and a hydroxyl group-containing isoprene elastomer can be used. The content of each of these elastomers preferably falls within the range of 1 to 50 mass % based on the total composition and appropriately 3 to 30 mass %. These elastomers may be used alone or in combination of two or more kinds.

[Mercapto Compound]

To the curable resin composition mentioned above, if necessary, a mercapto compound may be added. In case a mercapto compound is added to a curable resin composition for forming a resin insulating layer in contact with a substrate, it is expected to improve particularly PCT resistance and HAST resistance. This is considered because adhesiveness is improved.

Examples of the mercapto compound include mercaptoethanol, mercapto propanol, mercapto butanol, mercapto propane diol, mercapto butane diol, hydroxybenzene thiol, and derivatives thereof such as 1-butanthiol, butyl-3-mercapto propionate, methyl-3-mercapto propionate, 2,2-(ethylenedioxy)diethanethiol, ethanethiol, 4-methylbenzenethiol, dodecyl mercaptan, propanethiol, butanethiol, pentanethiol, 1-octanethiol, cyclo-pentanethiol, cyclohexanethiol, thioglycerol and 4,4-thiobisbenzenethiol.

Examples of commercially available products of these include BMPA, MPM, EHMP, NOMP, MBMP, STMP, TMMP, PEMP, DPMP and TEMPIC (all are manufactured by Sakai Chemical Industry Co., Ltd) and Karenz MT-PE1, Karenz MT-BD1 and Karenz-NR1 (all are manufactured by Showa Denko K.K.).

Examples of a mercapto compound having a heterocyclic ring include mercapto-4-butyrolactone (another name: 2-mercapto-4-butanolide), 2-mercapto-4-methyl-4-butyrolactone, 2-mercapto-4-ethyl-4-butyrolactone, 2-mercapto-4-butyrothiolactone, 2-mercapto-4-butyrolactam, N-methoxy-2-mercapto-4-butyrolactam, N-ethoxy-2-mercapto-4-butyrolactam, N-methyl-2-mercapto-4-butyrolactam, N-ethyl-2-mercapto-4-butyrolactam, N-(2-methoxy)ethyl-2-mercapto-4-butyrolactam, N-(2-ethoxyl)ethyl-2-mercapto-4-butyrolactam, 2-mercapto-5-valerolactone, 2-mercapto-5-valerolactam, N-methyl-2-mercapto-5-valerolactam, N-ethyl-2-mercapto-5-valerolactam, N-(2-methoxyl)ethyl-2-mercapto-5-valerolactam, N-(2-ethoxyl)ethyl-2-mercapto-5-valerolactam, 2-mercaptobenzothiazole, 2-mercapto-5-methylthio-thiadiazole, 2-mercapto-6-hexanolactam, 2,4,6-trimercapto-s-triazine (trade name: ZISNET F, manufactured by Sankyo Kasei Co., Ltd.); 2-dibutylamino-4,6-dimercapto-s-triazine (trade name: ZISNET DB, manufactured by Sankyo Kasei Co., Ltd.); and 2-anilino-4,6-dimercapto-s-triazine (trade name: ZISNET AF, manufactured by Sankyo Kasei Co., Ltd.).

Of them, 2-mercaptobenzimidazole, 2-mercaptobenzoxazole, 2-mercaptobenzothiazole (trade name: Accel M, manufactured by Kawaguchi Chemical Industry Co., LTD.), 3-mercapto-4-methyl-4H-1,2,4-triazole, 5-methyl-1,3,4-thiadiazole-2-thiol and 1-phenyl-5-mercapto-1H-tetrazole are preferred.

The content of such a mercapto compound is appropriately 0.01 mass % or more and 10.0 mass % or less based on the total composition and preferably 0.05 mass % or more or 5 mass % or less. If the content is less than 0.01 mass %, adhesiveness improvement, which is an effect of addition of a mercapto compound, is not observed. In contrast, if the content exceeds 10.0 mass %, a development defect of a photosensitive resin composition and a reduction in width under drying control occur. Thus the content beyond 10.0 mass % is not preferred. These mercapto compounds may be used alone or in combination of two or more kinds.

[Colorant]

To the above-mentioned curable resin composition, a colorant can be blended. As the colorant, routinely used colorants known in the art, such as red, blue, green and yellow, can be used and any one of a pigment, a dye and a coloring agent may be used. Specific examples include colorants having the following color index numbers (C.I.) which are issued by The Society of Dyers and Colourists. It is preferable that halogen be not contained from the viewpoints of environmental load (reduction) and effect on the human body.

Red Colorant:

Examples of a red colorant include monoazo, disazo, azolake, a benzimidazolone, perylene, diketo-pyrrolo-pyrrole, condensed azo, anthraquinone and quinacridon colorants. Specific examples are as follows:

Monoazo colorants: Pigment Red 1, 2, 3, 4, 5, 6, 8, 9, 12, 14, 15, 16, 17, 21, 22, 23, 31, 32, 112, 114, 146, 147, 151, 170, 184, 187, 188, 193, 210, 245, 253, 258, 266, 267, 268 and 269.

Disazo colorants: Pigment Red 37, 38 and 41.

Monoazo lake colorants: Pigment Red 48:1, 48:2, 48:3, 48:4, 49:1, 49:2, 50:1, 52:1, 52:2, 53:1, 53:2, 57:1, 58:4, 63:1, 63:2, 64:1 and 68.

Benzimidazolone colorants: Pigment Red 171, Pigment Red 175, Pigment Red 176, Pigment Red 185 and Pigment Red 208.

Perylene colorants: Solvent Red 135, Solvent Red 179, Pigment Red 123, Pigment Red 149, Pigment Red 166, Pigment Red 178, Pigment Red 179, Pigment Red 190, Pigment Red 194 and Pigment Red 224.

Diketo-pyrrolo-pyrrole colorants: Pigment Red 254, Pigment Red 255, Pigment Red 264, Pigment Red 270 and Pigment Red 272.

Condensed azo colorants: Pigment Red 220, Pigment Red 144, Pigment Red 166, Pigment Red 214, Pigment Red 220, Pigment Red 221 and Pigment Red 242.

Anthraquinone colorants: Pigment Red 168, Pigment Red 177, Pigment Red 216, Solvent Red 149, Solvent Red 150, Solvent Red 52 and Solvent Red 207.

Quinacridon colorants: Pigment Red 122, Pigment Red 202, Pigment Red 206, Pigment Red 207 and Pigment Red 209.

Blue Colorant:

Examples of a blue colorant include phthalocyanine and anthraquinone colorants. As a pigment thereof, compounds classified into pigments, specifically, the following pigments may be mentioned: Pigment Blue 15, Pigment Blue 15:1, Pigment Blue 15:2, Pigment Blue 15:3, Pigment Blue 15:4, Pigment Blue 15:6, Pigment Blue 16 and Pigment Blue 60.

Examples of a dye thereof include Solvent Blue 35, Solvent Blue 63, Solvent Blue 68, Solvent Blue 70, Solvent Blue 83, Solvent Blue 87, Solvent Blue 94, Solvent Blue 97, Solvent Blue 122, Solvent Blue 136, Solvent Blue 67 and Solvent Blue 70. Besides those mentioned above, a metal substituted or unsubstituted phthalocyanine compound can be used.

Green Colorant:

Examples of a green colorant include phthalocyanine, anthraquinone similarly to the above, and perylene. Specific examples thereof that can be used include Pigment Green 7, Pigment Green 36, Solvent Green 3, Solvent Green 5, Solvent Green 20 and Solvent Green 28. Besides those mentioned above, a metal substituted or unsubstituted phthalocyanine compound can be used.

Yellow Colorant:

Examples of a yellow colorant include monoazo, disazo, condensed azo, benzimidazolone, isoindolinone and anthraquinone colorants. Specific examples thereof are as follows:

Anthraquinone colorants: Solvent Yellow 163, Pigment Yellow 24, Pigment Yellow 108, Pigment Yellow 193, Pigment Yellow 147, Pigment Yellow 199 and Pigment Yellow 202.

Isoindolinone colorants: Pigment Yellow 110, Pigment Yellow 109, Pigment Yellow 139, Pigment Yellow 179 and Pigment Yellow 185.

Condensed azo colorants: Pigment Yellow 93, Pigment Yellow 94, Pigment Yellow 95, Pigment Yellow 128, Pigment Yellow 155, Pigment Yellow 166 and Pigment Yellow 180.

Benzimidazolone colorants: Pigment Yellow 120, Pigment Yellow 151, Pigment Yellow 154, Pigment Yellow 156, Pigment Yellow 175 and Pigment Yellow 181.

Monoazo colorants: Pigment Yellow 1, 2, 3, 4, 5, 6, 9, 10, 12, 61, 62, 62:1, 65, 73, 74, 75, 97, 100, 104, 105, 111, 116, 167, 168, 169, 182 and 183.

Disazo colorants: Pigment Yellow 12, 13, 14, 16, 17, 55, 63, 81, 83, 87, 126, 127, 152, 170, 172, 174, 176, 188 and 198.

Besides these, for example, purple, orange, brown and black colorants may be added in order to control color tone.

Specific examples thereof include Pigment Violet 19, 23, 29, 32, 36, 38, 42, Solvent Violet 13, 36, C.I. pigment orange 1, C.I. pigment orange 5, C.I. pigment orange 13, C.I. pigment orange 14, C.I. pigment orange 16, C.I. pigment orange 17, C.I. pigment orange 24, C.I. pigment orange 34, C.I. pigment orange 36, C.I. pigment orange 38, C.I. pigment orange 40, C.I. pigment orange 43, C.I. pigment orange 46, C.I. pigment orange 49, C.I. pigment orange 51, C.I. pigment orange 61, C.I. pigment orange 63, C.I. pigment orange 64, C.I. pigment orange 71, C.I. pigment orange 73, C.I. pigment blown 23, C.I. pigment blown 25, C.I. pigment black 1, C.I. and pigment black 7.

Although the colorants as mentioned above can be each appropriately blended, the content of colorants is preferably 10 mass % or less, more preferably, 0.05 to 5 mass % based on the total composition.

[Curing Accelerator]

In the present invention, in addition of (A) an imidazole-isocyanate adduct of the present invention, a curing accelerator (curing catalyst) for an epoxy compound and an oxetane compound, and a curing accelerator (curing catalyst) for a reaction between an epoxy group or an oxetanyl group with a carboxyl group or a phenol group may be used. In case another insulating resin layer is provided as described later, (A) an imidazole-isocyanate adduct of the present invention may not be used.

Examples of the curing accelerator include imidazole derivatives such as dicyandiamide, melamine, imidazole, benzimidazole, 2-methylimidazole, 2-ethylimidazole, 2-ethyl-4-methylimidazole, 2-phenylimidazole, 4-phenylimidazole, 1-cyanoethyl-2-phenylimidazole and 1-(2-cyanoethyl)-2-ethyl-4-methylimidazole; amine compounds such as benzyl dimethylamine, 4-(dimethylamino)-N,N-dimethylbenzylamine, 4-methoxy-N,N-dimethylbenzylamine and 4-methyl-N,N-dimethylbenzylamine; heterocyclic compounds such as benzoxazole, benzothiazole and benzotriazole; tertiary phosphines such as triphenylphosphine, tri-p-tolylphosphine, tri-o-tolylphosphine, tri-m-tolylphosphine and trinadono-2,4-xylylphosphine; and quaternary phosphonium salts such as tetraphosphonium tetraphenylborate, tetraphenylphosphonium-tetraparamethylphenyl borate, tetraphenylphosphonium thiocyanate and tetrabutylphosphonium decanoate. Of them, a quaternary phosphonium salt is preferred. Of them, tetraphenylphosphonium-tetraparamethylphenyl borate is particularly preferable in view of storage stability.

These curing accelerators may be used alone or as a combination of two or more kinds.

The content of the curing accelerator is generally 0.01 mass % to 15 mass %, more preferably 0.1 to 10 mass % based on the total composition.

[Dry Film 1]

Dry film 1 of the present invention has a curable resin layer formed by applying the curable resin composition of the present invention, followed by drying. Dry film 1 of the present invention is used so as to laminate the curable resin layer in contact with the substrate.

Dry film 1 of the present invention can be prepared by uniformly applying a curable resin composition to a carrier film by an appropriate means such as a blade coater, a lip coater, a comma coater and a film coater, followed by drying to form a curable resin layer as mentioned above and preferably laminating a cover film on the curable resin layer. The materials for forming the cover film and the carrier film may be the same or different.

In the dry film 1 of the present invention, any of film materials known in the art as a film material for use in a dry film can be used for the carrier film and the cover film.

As carrier film 1, a thermoplastic film such as a polyester film (e.g., poly(ethylene terephthalate)) having a thickness of, for example, 2 to 150 μm, can be used.

As the cover film, for example, a polyethylene film or a polypropylene film can be used. A film having smaller adhesion force to the curable resin layer than that of the carrier film is preferably used.

In the present invention, the thickness of curable resin layer formed on the carrier film is preferably 100 μm or less, more preferably in the range of 5 to 50 μm.

[Printed Wiring Board]

The printed wiring board of the present invention is preferably prepared by use of the curable resin layer of the present invention constituting the dry film of the present invention. It is preferable that a resin insulating layer be formed by, for example, laminating a dry film having a curable resin layer and heating the dry film to, for example, a temperature of about 140 to 180° C. to thermally cure the curable resin layer.

In the printed wiring board of the present invention, a resin insulating layer may be formed by directly applying a curable resin composition to a substrate by an appropriate means such as a blade coater, a lip coater, a comma coater and a film coater, followed by drying.

Patterning of the resin insulating layer of the printed wiring board of the present invention can be performed by irradiation of a semiconductor laser such as $CO_2$ laser or UV-YAG laser. Further, holes can be formed by $CO_2$ laser or UV-YAG laser or by a drill. In case the resin insulating layer has a plurality of layers, not only through-holes enabling conduction between any layers constituting the resin insulating layer but also partial holes (conformal via-holes) for use in conduction between an inner-layer circuit and the surface of the resin insulating layer can be formed.

After drilling, the resin insulating layer is treated with a commercially available desmear liquid (roughening agent) or a solution containing an oxidizer, such as a permanganate, a dichromate, ozone, a hydrogen peroxide/sulfuric acid and nitric acid, for removing smear (residual dross) on the inner wall and the bottom portion of holes and forming a rough surface having minute projections and depressions to obtain an anchoring effect to a conducting layer (a metal plated layer to be formed thereafter).

Subsequently, on the roughened coating film having holes (from which residue is removed by a desmear liquid) and having minute projections and depressions, a circuit is formed by a subtractive method or a semi-additive method. In any of the methods, after either one or both of non-electrolytic plating and electrolytic plating are applied, heat treatment (annealing treatment) may be applied at about 80° C. to 180° C. for about 10 to 60 minutes in order to remove metal stress and improve strength.

Examples of materials used in the metal plating include, although not particularly limited to, copper, tin, solder and nickel, or a combination thereof. A metal may be applied herein by sputtering in place of plating.

In case the resin insulating layer is formed of a photosensitive curable resin layer or a dried coating film which is obtained by applying a curable resin composition followed by drying, patterning of the curable resin layer or the dried coating film formed on a substrate can be carried out in accordance with a contact system (or non-contact system). More specifically, the patterning can be conducted by selectively applying an active energy beam through a photomask having a pattern formed thereon or by use of a laser direct light exposure machine. In the curable resin layer and dried coating film, a portion exposed to light (irradiated with an active energy beam) is cured.

Examples of the light exposure machine used for irradiation of an active energy beam include a direct drawing apparatus (for example, a laser direct imaging apparatus directly drawing images by a laser based on CAD data stored in a computer), a light exposure machine installed with a metal halide lamp, a light exposure machine having a (ultra) high pressure mercury lamp installed therein, a light exposure machine having LED installed therein and a light exposure apparatus having a mercury short-arc lamp installed therein.

As the active energy beam, light having a maximum wavelength within the range of 350 to 410 nm is preferably used. When the maximum wavelength falls within the range, radicals can be efficiently generated from a photopolymerization initiator. The light exposure amount varies depending upon the film thickness, etc.; however, the light exposure amount generally falls within the range of 5 to 500 mJ/cm$^2$ and preferably 10 to 300 mJ/cm$^2$.

As the direct drawing apparatus, for example, apparatuses manufactured by, for example, Japan Orbotech Ltd., Pentax Corporation, Oak Corporation and Dainippon Screen Co., Ltd. can be used. Any apparatus may be used as long as an active energy beam having a maximum wavelength of 350 to 410 nm can be emitted.

After the curable resin layer or a dried coating film is exposed to light in this manner and the portion exposed to light (a portion irradiated with an active energy beam) is allowed to cured, a portion not exposed to light is developed with a diluted aqueous alkali solution (for example, a 0.3 to 3 wt % aqueous sodium carbonate solution) to form a pattern in the curable resin layer or the dried coating film.

Examples of the development method include a dipping method, a shower method, a spray method and a brush method. Examples of the developer that can be used include aqueous solutions containing an alkali such as potassium hydroxide, sodium hydroxide, sodium carbonate, potassium carbonate, sodium phosphate, sodium silicate, ammonia and amine.

Further, a curable resin layer is thermally cured by heating to, for example, about 140 to 180° C. In this way, the carboxyl group of a carboxyl group-containing resin reacts with a thermosetting component having, for example, a plurality of cyclic ether groups in its molecule to form a resin insulating layer (pattern) excellent in properties such as heat resistance, chemical resistance, moisture-absorption resistance, adhesiveness and insulation reliability.

The total film thickness of the resin insulating layers in the printed wiring board of the present invention is preferably 100 μm or less, more preferably within the range of 5 to 50 μm.

Examples of the substrate that can be used include, besides a printed wiring board and a flexible printed wiring board on which a circuit is previously formed, a copper clad laminate (all grades, FR-4, etc.), a polyimide film substrate, a PET film substrate, a glass substrate, a ceramic substrate and a wafer using a composite such as a paper-phenol resin, a paper-epoxy resin, a woven glass fabric-epoxy resin, a glass-polyimide, a woven glass fabric/nonwoven fabric-epoxy resin, a woven glass fabric/paper-epoxy resin, a synthetic fiber-epoxy resin, fluororesin/polyethylene/polyphenylene ether, and polyphenylene oxide cyanate ester.

The resin insulating layer that the printed wiring board of the present invention has is suitable as a permanent coating film, particularly suitable as a solder resist and an interlayer insulating material.

Subsequently, the laminate of the present invention will be described.

The laminate of the present invention has a substrate and a plurality of resin insulating layers formed on the substrate, in which the one of the plural resin insulating layers in contact with the substrate is an insulating resin layer (L1) having at least (A) an imidazole-isocyanate adduct. Preferably, the insulating resin layer (L1) has a characteristic feature that the layer L1 is formed of a curable resin composition containing (A) an imidazole-isocyanate adduct of the present invention as mentioned above, (B) a carboxyl group-containing resin and (C) a thermosetting resin. This is characteristic requirements for the laminate of the present invention. In addition, resin insulating layers (L2) except the layer in contact with the substrate generally, are formed of different curable resin composition(s) from that of the insulating resin layer (L1). The resin insulating layers (L2) are preferably excellent in other properties such as insulating property and particularly preferably excellent in insulating property. To satisfy this, the resin insulating layer (L2) preferably contains a P atom-containing curing accelerator.

An example of a basic structure of a laminate of the present invention is shown in FIG. 1. The plural resin insulating layers generally consist of two layers, that is, an insulating resin layer (L1) provided in contact with a substrate (S) and a surface layer, i.e., the outermost layer, as shown in FIG. 1. The surface layer is the resin insulating layer (L2) as mentioned above. Other layers may be provided between the insulating resin layer (L1) and the surface layer. Instead of providing other layers, for example, the insulating resin layers (L1) and the resin insulating layers (L2) may be alternately laminated one top of the other, for example, a structure of an insulating resin layer (L1)/resin insulating layer (L2)/insulating resin layer (L1)/resin insulating layer (L2).

In a preferable embodiment of the present invention, the curable resin composition for forming the resin insulating layer (L1) and the curable resin composition for forming the resin insulating layer (L2) may contain the same or different components except an imidazole-isocyanate adduct and a curing accelerator such as a P atom-containing curing accelerator. However, the components except an imidazole-isocyanate adduct and a curing accelerator are preferably the same in view of adhesiveness between resin insulating layers and cost. In addition, it is preferable that the curable resin composition for forming the resin insulating layer (L1) do not substantially contain a P atom-containing curing accelerator, and that the curable resin composition for forming the resin insulating layer (L2) do not substantially contain an imidazole-isocyanate adduct.

[Laminate]

In the laminate of the present invention, a plurality of resin insulating layers are preferably formed of a plurality of curable resin layers constituting a dry film 2 of the present invention.

A laminate having a resin insulating layer (L1) and a resin insulating layer (L2) is preferably formed, for example, by laminating dry film 2, which has a curable resin layer (L2') containing a P atom-containing curing accelerator and a curable resin layer (L1') containing an imidazole-isocyanate adduct, on a substrate and thermally curing the resultant laminate by heating it to a temperature, for example about 140 to 180° C.

In the laminate of the present invention, a resin insulating layer may be formed by directly applying a resin composition to a substrate by an appropriate means such as a blade coater, a lip coater, a comma coater and a film coater, followed by drying. In this case, the resin composition is applied such that the resin insulating layer (L1) comes into contact with the substrate. Alternatively, a resin insulating layer (L1) is formed by applying a resin composition onto a substrate, followed by drying (curing) it and a dry film having only a curable resin layer (L2') is laminated on the resin insulating layer obtained above to form a resin insulating layer (L2). This method may be employed.

Conversely, a dry film only having a curable resin layer (L1') is laminated on a substrate to form a resin insulating layer (L1) and a resin composition is applied to the insulating resin layer, followed by drying to form a resin insulating layer (L2).

If other layers are provided between the resin insulating layer (L1) and the resin insulating layer (L2), lamination of a dry film and application/drying can be appropriately used for the provision of the layers, similarly to the above.

In the laminate of the present invention, patterning of a plurality of resin insulating layers can be carried out in the same manner as in the resin insulating layer of the printed wiring board of the present invention, as mentioned previously.

Patterning of a plurality of resin insulating layers of a laminate can be made by irradiation of a semiconductor laser such as $CO_2$ laser and UV-YAG laser. Furthermore, holes can be formed by $CO_2$ laser or UV-YAG laser or by a drill. Not only through-holes enabling conduction to any layers constituting the laminate but also partial holes (conformal via-holes) for use in conduction between an inner-layer circuit and the surface of the laminate can be formed.

After drilling, the laminate is treated with a commercially available desmear liquid (roughening agent) or a solution containing an oxidizer, such as a permanganate, a dichromate, ozone, a hydrogen peroxide/sulfuric acid and nitric acid, in order to remove smear on the inner wall and the bottom portion of holes and form a rough surface having minute projections and depressions to thereby obtain an anchoring effect to a conducting layer (which is a metal plated layer to be formed thereafter).

Subsequently, on the roughened coating film having holes (from which residue is removed by a desmear liquid) and minute projections and depressions, a circuit is formed by a subtractive method or a semi-additive method. In any of the methods, after either one or both of non-electrolytic plating and electrolytic plating are applied, heat treatment (annealing treatment) may be applied at about 80° C. to 180° C. for about 10 to 60 minutes in order to remove metal stress and improve strength.

Examples of the metal used in the plating process include, although not particularly limited to, copper, tin, solder and nickel. A plurality of metals as mentioned may be used in combination. A metal may be deposited by sputtering in place of the plating.

In case the resin insulating layer is formed of a photosensitive curable resin layer or a dried coating film which is obtained by applying a curable resin composition followed by drying, patterning of the curable resin layer or the dried coating film formed on a substrate may be performed in accordance with a contact system (or non-contact system); more specifically, the patterning can be performed by selectively applying an active energy beam through a photomask having a pattern formed thereon or by use of a laser direct light exposure machine. In the curable resin layer and dried coating film, a portion exposed to light (irradiated with an active energy beam) is cured.

Examples of the light exposure machine which is used for irradiation of an active energy beam include a direct drawing apparatus (for example, a laser direct imaging apparatus directly drawing images by a laser based on CAD data stored in a computer), a light exposure machine installed with a metal halide lamp, a light exposure machine having a (ultra) high pressure mercury lamp installed therein, a light exposure machine having LED installed therein and a light exposure apparatus having a mercury short-arc lamp installed therein.

As the active energy beam, light having a maximum wavelength within the range of 350 to 410 nm is preferably used. When the maximum wavelength falls within the range, radicals can be efficiently generated from a photopolymerization initiator. Although the light exposure amount varies depending upon the film thickness, etc., the light exposure amount generally falls within the range of 5 to 500 mJ/cm$^2$ and preferably 10 to 300 mJ/cm$^2$.

As the direct drawing apparatus, for example, apparatuses manufactured by, for example, Japan Orbotech Ltd., Pentax Corporation, Oak Corporation and Dainippon Screen Co., Ltd. can be used. Any apparatus may be used as long as an active energy beam having a maximum wavelength of 350 to 410 nm can be emitted.

After the curable resin layer or a dried coating film is exposed to light in this manner and the portion exposed to light (a portion irradiated with an active energy beam) is allowed to cured, a portion not exposed to light is developed with a diluted aqueous alkali solution (for example, a 0.3 to 3 mass % aqueous sodium carbonate solution) to form a pattern in the curable resin layer or the dried coating film.

Examples of the developing method include a dipping method, a shower method, a spray method and a brush method. Examples of the developer which can be used in the method include aqueous solutions of an alkali such as potassium hydroxide, sodium hydroxide, sodium carbonate, potassium carbonate, sodium phosphate, sodium silicate, ammonia and amine.

In case a curable resin layer and a curable resin composition contains a thermosetting component, the layer or composition is thermally cured by heating to, for example, about 140 to 180° C., whereby carboxyl group of a carboxyl group-containing resin is reacted with a thermosetting component having, e.g., a plurality of cyclic ether groups in its molecule to thereby form a resin insulating layer (pattern) excellent in properties such as heat resistance, chemical resistance, moisture-absorption resistance, adhesiveness and insulation reliability.

The total film thickness of the resin insulating layers in the laminate of the present invention is preferably 100 µm or less and more preferably falls within the range of 5 to 50 µm. For example, in the case of a laminate having two resin insulating layers, it is preferable that the thickness of a resin insulating layer (L1) be 1 to 50 µm and the thickness of a resin insulating layer (L2) be 1 to 50 µm. The ratio of the resin insulating layer (L1) and the resin insulating layer (L2) preferably falls within the range of 1:9 to 9:1.

Examples of the substrate that can be used herein include, besides a printed wiring board and a flexible printed wiring board on which a circuit is previously formed, a copper clad laminate (all grades, FR-4, etc.), a polyimide film substrate, a PET film substrate, a glass substrate, a ceramic substrate and a wafer using a composite such as a paper-phenol resin, a paper-epoxy resin, a woven glass fabric-epoxy resin, a glass-polyimide, a woven glass fabric/nonwoven fabric-epoxy resin, a woven glass fabric/paper-epoxy resin, a synthetic fiber-epoxy resin, fluororesin/polyethylene/polyphenylene ether, and polyphenylene oxide cyanate ester.

[Dry Film 2]

A dry film 2 of the present invention can be preferably used for forming the laminate of the present invention, as described previously and composed of at least a curable resin layer (L1') and a curable resin layer (L2') formed on the carrier film. The curable resin layer (L1') is formed by applying the curable resin composition of the present invention, followed by drying. The curable resin layer (L2') is preferably formed by applying a curable resin composition containing a P atom-containing curing accelerator, followed by drying.

A dry film 2 of the present invention used has a curable resin layer (L1'), which is laminated in contact with a substrate. Thus, the layer in contact with a film or the outermost layer is the curable resin layer (L1'). Generally, the curable resin layer (L1') is formed on a carrier film and a curable resin layer (L2') is formed on the curable resin layer (L1').

The dry film of the present invention can be prepared by uniformly applying a resin composition to a carrier film by an appropriate means such as a blade coater, a lip coater, a comma coater and a film coater, followed by drying to form a curable resin layer as mentioned above and preferably laminating a cover film on the curable resin layer. The materials for forming the cover film and the carrier film may be the same or different.

In dry film of the present invention, any of film materials known in the art as a film material for use in a dry film can be used for the carrier film and the cover film.

As the carrier film, a thermoplastic film such as a polyester film (e.g., poly(ethylene terephthalate)) having a thickness of, e.g., 2 to 150 µm, can be used.

Although as the cover film, for example, a polyethylene film or a polypropylene film can be used; a film having smaller adhesion force to the curable resin layer than that of the carrier film is preferably used.

The total thickness of the curable resin layers in the carrier of the present invention is preferably 100 µm or less and more preferably falls within the range of 5 to 50 µm. For example, in the case of a dry film having two curable resin layers, it is preferable that the thickness of a curable resin layer (L1') be 1 to 50 µm and the thickness of a curable resin layer (L2') be 1 to 50 µm. The ratio of the curable resin layer (L1') and the curable resin layer (L2') preferably falls within the range of 1:9 to 9:1.

[Curable Resin Composition]

As material of a dry film for forming a resin insulating layer (L1) or a curable resin composition used in a coat liquid, the curable resin composition of the present invention comprising (A) an imidazole-isocyanate adduct, (B) a carboxyl group-containing resin and (C) a thermosetting resin as mentioned above is used. The curable resin composition may be either photosensitive or non-photosensitive. The photosensitive dry film or the photosensitive curable resin composition preferably is an alkali developable type which contains a carboxyl group-containing resin (if necessary, a phenol resin) having an ethylenically unsaturated double bond and is developed with alkali, and more preferably an alkali developable type which contains a carboxyl group-containing resin, a photopolymerization initiator and a thermosetting component.

Accordingly, the resin insulating layer (L1) of the present invention can be formed by using the curable resin composition of the present invention as mentioned above in accordance with the method as mentioned previously.

The curable resin composition for forming a resin insulating layer (L2) can be appropriately prepared generally by using materials as mentioned in the curable resin composition of the present invention such that the layer L2 has different properties from the resin insulating layer (L1). More specifically, a curable resin composition for forming the resin insulating layer (L1) and a curable resin composition for forming the resin insulating layer (L2) may contain the same or different components except an imidazole-isocyanate adduct and a curing accelerator such as a P atom-containing curing accelerator. In addition, it is preferable that the curable resin composition for forming the resin insulating layer (L2) do not substantially contain an imidazole-isocyanate adduct.

[P Atom-containing Curing Accelerator]

A dry film for forming a resin insulating layer (L2) or a curable resin composition used in a coat liquid preferably contains a P atom-containing curing accelerator. As the curing accelerator, any curing accelerator (curing catalyst) containing a P atom in its molecule may be used as long as it is known in the art. Preferable examples thereof include curing accelerators known in the art as a curing accelerator (curing catalyst) for an epoxy compound and an oxetane compound; and a curing accelerator (curing catalyst) for a reaction between an epoxy group and an oxetanyl group and a carboxyl group and a phenol group.

Example of the P atom-containing curing catalyst used in the present invention include tertiary phosphines such as triphenylphosphine, tri-p-tolylphosphine, tri-o-tolylphosphine, tri-m-tolylphosphine and trinadono-2,4-xylylphosphine; and quaternary phosphonium salts such as tetraphosphonium tetraphenylborate, tetraphenylphosphonium-tetraparamethylphenyl borate, tetraphenylphosphonium thiocyanate and tetrabutyl phosphonium decanoate. Of them, a quaternary phosphonium salt is preferred. Of them, tetraphenylphosphonium-tetraparamethylphenyl borate is particularly preferable in view of storage stability. These P atom-containing curing catalysts may be used alone or as a mixture (of two or more).

The content of the P atom-containing curing accelerator is sufficient as long as the content falls within a general range of the content. For example, the content is preferably 0.01 to 15 mass % based on the total composition and further preferably 0.1 to 10 mass %.

The laminate of the present invention obtained as mentioned above has a resin insulating layer excellent in adhesiveness and using an imidazole-isocyanate adduct as a curing catalyst and another layer for improving other properties including insulating property. Hence, the laminate of the present invention can be said to be a structure greatly improved in adhesiveness and insulation reliability as well as other properties.

EXAMPLES

Although the present invention will be more specifically described by way of Examples and Comparative Examples below; the present invention is not limited to the following Examples. The "part" and "%" in the following specification refer to "parts by mass" and "% by mass", respectively, unless otherwise specified.

Synthesis Example 1

(1-(3-Aminopropyl)imidazole hexamethylene diisocyanate adduct)

A three-neck flask equipped with a condenser, a dropping funnel and a thermocouple and placed on a mantle heater, was charged with 50 g (0.4 mole) of 1-(3-aminopropyl)imidazole and 250 mL of acetonitrile. Then, the solution mixture was heated to 70 to 80° C. To the solution mixture, 33.6 g (0.2 mole) of hexamethylene diisocyanate dissolved in 50 mL of acetonitrile was added dropwise to generate a white precipitate. After completion of addition, the mixture was stirred at 70 to 80° C. for one hour and then cooled to room temperature. The white solid substance was filtered and washed with acetonitrile to obtain an imidazole-isocyanate adduct (hereinafter simply referred to as A-1).

Synthesis Example 2

(1-(3-Aminopropyl)imidazole polymethylene(polyphenyl isocyanate) adduct)

In accordance with the procedure in Synthesis Example 1 (an imidazole-isocyanate adduct), 1-(3-aminopropyl)imidazole (63 g: 0.5 mole) was reacted with a polymethylene polyphenyl isocyanate (82.9 g: 0.3 mole). As a solid product, 1-(3-aminopropyl)imidazole-polymethylene polyphenyl isocyanate adduct was obtained (hereinafter simply referred to as A-2).

Synthesis Example 3

(2-Ethyl-4-methylimidazole hexamethylene diisocyanate adduct)

In accordance with the procedure in Synthesis Example 1 (an imidazole-isocyanate adduct), 2-ethyl-4-methylimidazole (22 g: 0.2 mole) was reacted with hexamethylene diisocyanate (16.8 g: 0 to 1 mole). As a solid product, a 2-ethyl-4-methylimidazole hexamethylene diisocyanate adduct was obtained (hereinafter simply referred to as A-3).

Synthesis Example 4

(Carboxyl group-containing resin (alkali-soluble resin))

To an autoclave equipped with a thermometer, an introduction apparatus for nitrogen and an alkylene oxide, and a stirrer, a novolak cresol resin (trade name, "Shonol CRG951", manufactured by Showa Highpolymer Co., Ltd, OH equivalent: 119.4) (119.4 parts), potassium hydroxide (1.19 parts) and toluene (119.4 parts) were supplied. The autoclave was purged with nitrogen while stirring and increased in temperature by heating. Subsequently, propylene oxide (63.8 parts) was gradually added dropwise and reacted at 125 to 132° C. and 0 to 4.8 kg/cm² for 16 hours. Thereafter, the reaction solution was cooled to room temperature. To the reaction solution, 89% phosphate (1.56 parts) was added and mixed to neutralize potassium hydroxide to obtain a reaction solution of propylene oxide and the novolak cresol resin having a nonvolatile content of 62.1%, a hydroxyl value of 182.2 mg KOH/g (307.9 g/eq.). In the solution, propylene oxide was added in 1.08 mole in average per an equivalent of a phenolic hydroxy group.

The resultant reaction solution (293.0 parts) of the novolak cresol resin and propylene oxide, acrylic acid (43.2 parts), methanesulfonic acid (11.53 parts), methyl hydroquinone (0.18 parts) and toluene (252.9 parts) were introduced in a reactor equipped with a stirrer, a thermometer and an air blowing pipe. The reaction was carried out at 110° C. for 12 hours while blowing air at a rate of 10 mL/minute and stirring. Water generated in the reaction is azeotropically distilled with toluene, with the result that water (12.6 parts) was distilled away. Thereafter, the reaction mixture was cooled to room temperature. The resultant reaction solution was neutralized with a 15% aqueous sodium hydroxide solution (35.35 parts) and then washed with water. Thereafter, toluene was distilled away by an evaporator with being replaced with diethylene glycol monoethyl ether acetate (118.1 parts) to obtain a novolak acrylate resin solution. Subsequently, the resultant novolak acrylate resin solution (332.5 parts) and triphenylphosphine (1.22 parts) were introduced in a reactor equipped with a stirrer, a thermometer and an air blowing pipe. The reaction was carried out by gradually adding tetrahydrophthalic acid anhydride (60.8 parts) at 95 to 101° C. for 6 hours while supplying air at a rate of 10 mL/min. and stirring. After cooled, a reaction product was taken out. In this manner, a solution containing a carboxyl group-containing photosensitive resin having a nonvolatile content of 65% and a solid-substance acid value of 87.7 mg KOH/g (hereinafter simply referred to as B-1) was obtained.

Examples 1 to 4 and Comparative Examples 1 to 3

(Preparation of Curable Resin Composition)

Curable resin compositions for a solder resist were prepared in accordance with the formulations (components and ratios (parts by mass)) shown in the following Table 1, preparatorily mixed by a stirrer and kneaded by three-roll mills.

TABLE 1

| Composition (parts by mass) | | Example | | | | Comparative Example | | |
|---|---|---|---|---|---|---|---|---|
| | | 1 | 2 | 3 | 4 | 1 | 2 | 3 |
| (A) Imidazole-isocyanate adduct | A-1 | 1 | 10 | | | | | |
| | A-2 | | | 1 | | | | |
| | A-3 | | | | 1 | | | |
| Imidazole | *1 | | | | | 1 | | |
| | *2 | | | | | | 1 | |
| Blocked isocyanate | *3 | | | | | | | 1 |
| (B)Alkali soluble resin | B-1 | 154 | 154 | 154 | 154 | 154 | 154 | 154 |
| (E)Acrylate compound | *4 | 20 | 20 | 20 | 20 | 20 | 20 | 20 |
| (C)Epoxy resin | *5 | 15 | 15 | 15 | 15 | 15 | 15 | 15 |
| | *6 | 15 | 15 | 15 | 15 | 15 | 15 | 15 |
| (D)Photopolymerization initiator | *7 | 1 | 1 | 1 | 1 | 1 | 1 | 1 |

TABLE 1-continued

| Composition | Example | | | | Comparative Example | | |
|---|---|---|---|---|---|---|---|
| (parts by mass) | 1 | 2 | 3 | 4 | 1 | 2 | 3 |
| Filler *8 | 20 | 20 | 20 | 20 | 20 | 20 | 20 |
| *9 | 80 | 80 | 80 | 80 | 80 | 80 | 80 |

The meanings of numeric characters with an asterisk in Table 1 are as follows:
*1: 2E4MZ (manufactured by Shikoku Chemicals Corporation)
*2: 1B2PZ (Manufactured by Shikoku Chemicals Corporation)
*3: Karenz MOI-BM (manufactured by Showa Denko K.K.)
*4: Dipentaerythritol hexaacrylate: manufactured by Nippon Kayaku Co., Ltd.
*5: Bixylenol epoxy resin (manufactured by Japan Epoxy Resins Co., Ltd.)
*6: Bisphenol A epoxy resin jER828 (manufactured by Mitsubishi Chemical Corporation)
*7: Ethanone, 1-[9-ethyl-6-(2-methylbenzoyl)-9H-carbazole-1-(O-acetyloxime), Irgacure-OXE02 (manufactured by BASF Japan Ltd.)
*8: B-30 (manufactured by Sakai Chemical Industry Co., Ltd)
*9: SO-E2 manufactured by Admatechs Company Limited.

[Preparation of Liquid Coating: Examples 1 to 4 and Comparative Examples 1 to 3]
(Optimum Light Exposure Amount)

A single-sided printed wiring substrate (a copper thickness of 15 µm) having a circuit formed thereon was prepared and pretreated with CZ8100 manufactured by MEC Co., Ltd. To the substrate, a curable resin layer according to each of Examples 1 to 4 and Comparative Examples 1 to 3 was formed by a screen printing method and dried at 80° C. in a dry furnace for 30 minutes to obtain a tack-free curable resin layer. Subsequently, the resultant substrate was exposed to light by use of a light exposure apparatus having a high pressure mercury lamp (short arc lamp) installed therein through a step tablet (Kodak No. 2) and developed (30° C., 0.2 MPa, a 1 mass % aqueous $Na_2CO_3$ solution) for 60 seconds. At this time, if the remaining number of step tablets was three, the amount of exposure light was specified to be optimum. In each of Examples 1 to 4 and Comparative Examples 1 to 3, the following tests were performed in a light exposure amount of 100 mJ/cm².

(Characteristic Test)

A single-sided printed wiring substrate (a copper thickness of 15 µm) having a circuit formed thereon was prepared and pretreated with CZ8100 manufactured by MEC Co., Ltd. To the substrate, a curable resin layer according to each of Examples and Comparative Examples was formed by a screen printing method and dried at 80° C. in a dry furnace for 30 minutes to obtain a tack-free curable resin layer. Subsequently, a solder resist pattern was formed by light exposure in the aforementioned optimum light exposure amount by use of a light exposure apparatus having a high pressure mercury short arc lamp installed therein and developed with a 1 mass % aqueous sodium carbonate solution at 30° C. and a spray pressure of 0.2 MPa for 60 seconds. The substrate was cured by applying UV ray in a UV conveyer furnace in a cumulated light exposure amount of 1000 mJ/cm² and heating it at 160° C. for 60 minutes. The resultant printed wiring board (evaluation substrate) was evaluated for the following properties.

<Peel Strength>

The following evaluation substrate was used in place of the substrate having a circuit formed thereon in the conditions for forming an evaluation substrate as mentioned above. The evaluation substrate was prepared by treating a 18 µm copper foil with CZ8100, an applying a curable resin composition according to each of Examples and Comparative Examples to the surface thus treated by a screen printing method and then drying it. To the completed insulating layer, a two pot type epoxy adhesive (Araldite) was applied to the side of the insulating layer. The substrate was turned upside down and copper of 1.6 mm t was allowed to adhere to an FR-4 substrate, the entire surface of which was etched, and cured at 60° C. for 5 hours. After curing, the copper foil attached to the insulating layer was cut out at a width of 1 cm. A peel test was carried out by peeling the copper foil at an angle of 90° and peel strength was obtained by a peel gauge.

○: 6N or more.
Δ: 3N or more and less than 6N.
×: less than 3N.

<Storage Stability>

A copper clad laminate having a copper thickness of 30 µm was prepared and pretreated with CZ8100 manufactured by MEC Co., Ltd. To the substrate, a curable resin layer according to each of Examples and Comparative Examples was formed by a screen printing method and dried at 80° C. in a dry furnace for 30 minutes to obtain a tack-free curable resin layer.

The test substrates obtained in this manner were stored in a constant-temperature vessel of 30° C. for 24 hours, developed and evaluated for storage stability based on the following criteria.

○: Development time does not increase.
Δ: Development time increases by 30% or more relative to the initial value.
×: Development residue is produced.

<PCT (Pressure Cooker Test) Resistance>

The evaluation substrates were placed in a high pressure/high temperature/high humidity tank (121° C. and 2 atm. and 100% humidity) for 300 hours. The state-change of each of the solder resists was evaluated based on the following evaluation criteria.

○: Neither significant bulge nor discoloration were observed.
Δ: No significant peeling is observed. Peeling partly occurs or discoloration is observed.
×: Significant bulge and discoloration are observed.

<Electric Characteristics>

Using a comb electrode pattern having a line/space=50/50 µm, evaluation substrates were prepared in the above conditions and evaluated for electric characteristics (insulation reliability, electrode corrosivity).

Evaluation method was as follows. To the comb electrode, a bias voltage of DC 30V was applied in heating and humidifying conditions (121° C., 97% R.H.) and time until the occurrence of insulation deterioration was measured. Insulation deterioration herein was determined when an ohmic value reached below $1 \times 10^{-6} \Omega$.

The evaluation criteria are as follows:
○: Time until the occurrence of insulation deterioration is 200 hours or more.
Δ: Time until the occurrence of insulation deterioration is 100 hours to 200 hours.
×: Time until the occurrence of insulation deterioration is less than 100 hours.

<Developability>

A single-sided printed wiring substrate (a copper thickness of 15 µm) having a circuit formed thereon was prepared and pretreated with CZ8100 manufactured by MEC Co., Ltd. To the substrate, a curable resin layer according to each of Examples 1 to 4 and Comparative Examples 1 to 3 was formed by a screen printing method and dried at 80° C. in a dry furnace for 60 minutes to obtain a tack-free curable resin layer. Subsequently, the dried coating film was developed with a 1 wt. % aqueous sodium carbonate solution at 30° C. and a spray pressure of 0.2 MPa for 60 seconds and developability was checked. The evaluation items are as follows:

○: No residue is observed and development can be made.
×: Residue remains.

[Preparation of Dry Film: Examples 1 to 4 and Comparative Examples 1 to 3]

Using the compositions of Examples 1 to 4 and Comparative Examples 1 to 3, dry films having a curable resin layer were prepared. Each of the dry film was prepared by applying a curable resin composition by an applicator to a polyester film having a thickness of 38 μm serving as a carrier film and drying the composition at 80° C. for 10 minutes and then applying a next curable resin composition, followed by drying at 80° C. for 10 minutes.

(Optimum Light Exposure Amount)

A single-sided printed wiring substrate (a copper thickness of 15 μm) having a circuit formed thereon was prepared and pretreated with CZ8100 manufactured by MEC Co., Ltd. To the substrate, a dry film according to each of Examples and Comparative Examples was allowed to adhere such that the curable resin layer comes into contact with the substrate by use of a vacuum laminator. The substrate was exposed to light by use of a light exposure apparatus having a high pressure mercury lamp (short arc lamp) installed therein through a step tablet (Kodak No. 2) and developed (30° C., 0.2 MPa, a 1 mass % aqueous $Na_2CO_3$ solution) for 60 seconds. At this time, if the remaining number of step tablets was three, the amount of exposure light was specified to be optimum. In each of Examples 1 to 4 and Comparative Examples 1 to 3, the following tests were performed at a light exposure amount of 100 mJ/cm².

(Characteristic Test)

A single-sided printed wiring substrate (a copper thickness of 15 μm) having a circuit formed thereon was prepared and pretreated with CZ8100 manufactured by MEC Co., Ltd. To the substrate, a dry film according to each of Examples and Comparative Examples was allowed to adhere such that the curable resin layer came into contact with the substrate by use of a vacuum laminator. A solder resist pattern was formed by light exposure in the aforementioned optimum light exposure amount by use of a light exposure apparatus having a high pressure mercury short arc lamp installed therein. After a carrier film was removed, the substrate was developed with a 1 mass % aqueous sodium carbonate solution at 30° C. and a spray pressure of 0.2 MPa for 60 seconds to obtain the solder resist pattern. The substrate was cured by applying UV ray in a UV conveyer furnace in a cumulated light exposure amount of 1000 mJ/cm² and heating it at 160° C. for 60 minutes. The resultant printed wiring board (evaluation substrate) was evaluated for the following properties.

<Peel Strength>

The following evaluation substrate was used in place of the substrate having a circuit formed thereon in the conditions for forming an evaluation substrate as mentioned above. The evaluation substrate was prepared by treating a 18 μm copper foil with CZ8100, laminating a curable resin layer using a photosensitive dry film according to each of Examples and Comparative Examples to the surface thus treated by a screen printing method. To the completed insulating layer, a two pot type epoxy adhesive (Araldite) was applied to the side of the insulating layer. The substrate was turned upside down and copper of 1.6 mm t was allowed to adhere to an FR-4 substrate, the entire surface of which was etched and cured at 60° C. for 5 hours. After curing, the copper foil attached to the insulating layer was cut out at a width of 1 cm. A peel test was performed by peeling the copper foil at an angle of 90° and peel strength was obtained based on peel gauge.

◯: 6N or more.
Δ: 3N or more and less than 6N.
×: less than 3N.

<Storage Stability>

A copper clad laminate having a copper thickness of 30 μm was prepared and pretreated with CZ8100 manufactured by MEC Co., Ltd. To the substrate, a dry film according to each of Examples and Comparative Examples was allowed to adhere such that the dry film came into contact with a curable resin layer by use of a vacuum laminator.

The test substrates obtained in this manner were stored in a constant-temperature vessel of 30° C. for 24 hours, developed and evaluated for storage stability based on the following criteria.

◯: Development time does not increase.
Δ: Development time increases by 30% or more relative to the initial value.
×: Development residue is produced.

<PCT Resistance>

The evaluation substrates were placed in a high pressure/high temperature/high humidity vessel (121° C. and 2 atm. and 100% humidity) for 300 hours. The state-change of each resin insulating layer was evaluated based on the following evaluation criteria.

◯: Neither significant bulge nor discoloration were observed.
Δ: No significant peeling is observed. Peeling partly occurs or discoloration is observed.
×: Significant bulge and discoloration are observed.

<Electric Characteristics>

Using a comb electrode pattern having a line/space=50/50 μm, evaluation substrates were prepared in the above conditions and evaluated for electric characteristics (insulation reliability, electrode corrosivity).

Evaluation method was as follows. To the comb electrode, a bias voltage of DC 30V was applied in heating and humidifying conditions (121° C., 97% R.H.) and time until the occurrence of insulation deterioration was measured. Insulation deterioration herein was determined when an ohmic value reached below $1\times10^{-6}\Omega$.

The evaluation criteria are as follows:
◯: Time until the occurrence of deterioration is 200 hours or more.
Δ: Time until the occurrence of insulation deterioration is 100 hours to 200 hours.
×: Time until the occurrence of insulation deterioration is less than 100 hours.

TABLE 2

| Property test | Example 1 | | Example 2 | | Example 3 | | Example 4 | | Comparative Example 1 | | Comparative Example 2 | | Comparative Example 3 | |
|---|---|---|---|---|---|---|---|---|---|---|---|---|---|---|
| Embodiment | L | D | L | D | L | D | L | D | L | D | L | D | L | D |
| Peel strength | ◯ | ◯ | ◯ | ◯ | ◯ | ◯ | ◯ | ◯ | ◯ | ◯ | ◯ | ◯ | × | × |

TABLE 2-continued

| Property test | Example 1 | | Example 2 | | Example 3 | | Example 4 | | Comparative Example 1 | | Comparative Example 2 | | Comparative Example 3 | |
|---|---|---|---|---|---|---|---|---|---|---|---|---|---|---|
| Storage stability | ○ | ○ | ○ | ○ | ○ | ○ | ○ | ○ | X | X | X | X | ○ | ○ |
| PCT resistance | ○ | ○ | ○ | ○ | ○ | ○ | ○ | ○ | X | X | X | X | X | X |
| Electric characteristics | ○ | ○ | ○ | ○ | ○ | ○ | ○ | ○ | X | X | X | X | X | X |
| Developability | ○ | ○ | ○ | ○ | ○ | ○ | ○ | ○ | X | X | X | X | X | X |

Note)
Embodiment L: liquid coating, D: dry film

As is apparent from the above results, Examples 1 to 4 where the imidazole-isocyanate adduct of the present invention was added as a catalyst to a combination of (B) an alkali-soluble resin and (C) an epoxy resin were excellent in all of peel strength, storage stability, PCT resistance and electric characteristics. In contrast, Comparative Examples 1 and 2 where imidazole was used as a catalyst, showed unsatisfactory storage stability, PCT resistance and electric characteristics. Comparative Example 3 where a blocked isocyanate conventionally used was employed as a catalyst, displayed unsatisfactory peel strength, PCT resistance and electric characteristics not to show sufficient properties.

[Composition Examples 1 to 9] (Preparation of Photosensitive Resin Composition)

Curable resin compositions for a solder resist were prepared in accordance with the components shown in the following Table 3 and ratios (parts by mass) shown in Table 3 and preparatorily mixed by a stirrer and kneaded by three-roll mills.

[Table 3]

[Preparation of Dry Film: Examples 5 to 12 and Comparative Examples 4 to 6]

Using photosensitive resin compositions 1 to 9, dry films each having a multi-layered curable resin layer on which pattern can be formed were prepared in accordance with the combination shown in the following Table 4. Each of the dry films was prepared by applying a curable resin composition to a polyester film having a thickness of 38 μm serving as a carrier film by an applicator, drying the composition at 80° C. for 10 minutes, and then repeating a step of applying a next curable resin composition, followed by drying at 80° C. for 10 minutes. The application of the curable resin compositions to a substrate was started from the curable resin composition for forming the outermost layer as viewed from the substrate.

TABLE 3

| Composition (parts by mass) | | Composition Example | | | | | | | | |
|---|---|---|---|---|---|---|---|---|---|---|
| | | (1) | (2) | (3) | (4) | (5) | (6) | (7) | (8) | (9) |
| Imidazoleisocyanate adduct | A-1 | 1 | 10 | | | | | | | |
| | A-2 | | | 1 | | | | | | |
| | A-3 | | | | 1 | | | | | |
| Imidazole | *1 | | | | | 1 | | | | |
| | *2 | | | | | | 1 | | | |
| Blocked isocyanate | *3 | | | | | | | 1 | | |
| Alkali soluble resin | B-1 | 154 | 154 | 154 | 154 | 154 | 154 | 154 | 154 | 154 |
| Acrylate compound | *4 | 20 | 20 | 20 | 20 | 20 | 20 | 20 | 20 | 20 |
| Epoxy resin | *5 | 15 | 15 | 15 | 15 | 15 | 15 | 15 | 15 | 15 |
| | *6 | 15 | 15 | 15 | 15 | 15 | 15 | 15 | 15 | 15 |
| Photopolymerization initiator | *7 | 1 | 1 | 1 | 1 | 1 | 1 | 1 | 1 | 1 |
| Filler | *8 | 20 | 20 | 20 | 20 | 20 | 20 | 20 | 20 | 20 |
| | *9 | 80 | 80 | 80 | 80 | 80 | 80 | 80 | 80 | 80 |
| P-atom containing compound | *10 | | | | | | | | | 1 |

The meanings of numeric characters with an asterisk in Table 1 are as follows:
*1: 2E4MZ (manufactured by Shikoku Chemicals Corporation)
*2: 1B2PZ (Manufactured by Shikoku Chemicals Corporation)
*3: Karenz MOI-BM (manufactured by Showa Denko K.K.)
*4: Dipentaerythritol hexaacrylate: manufactured by Nippon Kayaku Co., Ltd.
*5: Bixylenol epoxy resin (manufactured by Japan Epoxy Resins Co., Ltd.)
*6: Bisphenol A epoxy resin jER828 (manufactured by Mitsubishi Chemical Corporation)
*7: Ethanone, 1-[9-ethyl-6-(2-methylbenzoyl)-9H-carbazole-1-(O-acetyloxime), Irgacure-OXE02 (manufactured by BASF Japan Ltd.)
*8: B-30 (manufactured by Sakai Chemical Industry Co., Ltd)
*9: SO-E2 manufactured by Admatechs Company Limited.
*10: Tri-p-tolylphosphine

TABLE 4

| Composition Example | Example | | | | | | | | Comparative Example | | |
|---|---|---|---|---|---|---|---|---|---|---|---|
| | 5 | 6 | 7 | 8 | 9 | 10 | 11 | 12 | 4 | 5 | 6 |
| (1) | L1 (5 μm) | | | | L1 (5 μm) | L1 (5 μm) | L1 (5 μm) | L1 (5 μm) | — | | |
| (2) | | L1 (5 μm) | | | | | | | — | | |
| (3) | | | L1 (5 μm) | | | | | | — | | |
| (4) | | | | L1 (5 μm) | | | | | — | | |
| (5) | | | | | | | | L2 (15 μm) | L1 (5 μm) | | |
| (6) | | | | | | | L2 (15 μm) | | | L1 (5 μm) | |
| (7) | | | | | | L2 (15 μm) | | | | | L1 (5 μm) |
| (8) | L2 (15 μm) | L2 (15 μm) | L2 (15 μm) | L2 (15 μm) | | | | — | L2 (15 μm) | L2 (15 μm) | L2 (15 μm) |
| (9) | | | | | L2 (15 μm) | | | | | | |

Note)
L1: Resin insulating layer (L1) (see FIG. 1)
L2: Resin insulating layer (L2) (see FIG. 1)
Figures in parentheses: film thickness (Optimum Light Exposure Amount)

A single-sided printed wiring substrate (a copper thickness of 15 μm) having a circuit formed thereon was prepared and pretreated with CZ8100 manufactured by MEC Co., Ltd. To the substrate, a dry film according to each of Examples and Comparative Examples was allowed to adhere such that a L1 layer came into contact with the substrate by use of a vacuum laminator to form a double-layered curable resin layer on the substrate. The substrate was exposed to light by use of a light exposure apparatus having a high pressure mercury lamp (short arc lamp) installed therein through a step tablet (Kodak No. 2) and developed (30° C., 0.2 MPa, a 1 mass % aqueous $Na_2CO_3$ solution) for 60 seconds. At this time, if the remaining number of step tablets was three, the amount of exposure light was specified to be optimum. In each of Examples 5 to 12 and Comparative Examples 4 to 6, the following tests were performed at a light exposure amount of 100 mJ/cm$^2$.

(Characteristic Test)

A single-sided printed wiring substrate (a copper thickness of 15 μm) having a circuit formed thereon was prepared and pretreated with CZ8100 manufactured by MEC Co., Ltd. To the substrate, a dry film according to each of Examples and Comparative Examples was allowed to adhere such that a L1 layer was into contact with the substrate by use of a vacuum laminator to form a laminate curable resin layer on the substrate. A solder resist pattern was formed by light exposure in the aforementioned optimum light exposure amount by use of a light exposure apparatus having a high pressure mercury short arc lamp installed therein and developed with a 1 mass % aqueous sodium carbonate solution at 30° C. and a spray pressure of 0.2 MPa for 60 seconds. The substrate was cured by applying UV ray in a UV conveyer furnace in a cumulated light exposure amount of 1000 mJ/cm$^2$ and heating it at 160° C. for 60 minutes. The resultant printed wiring board (evaluation substrate) was evaluated for the following properties.

<Peel Strength>

The following evaluation substrate was used in place of the substrate having a circuit formed thereon in the conditions for forming an evaluation substrate as mentioned above. The evaluation substrate was prepared by treating a 18 μm copper foil with CZ8100, laminating a L1 layer and a L2 layer using a photosensitive dry film according to each of Examples and Comparative Examples to the surface thus treated by a screen printing method. To the completed insulating layer, a two pot type epoxy adhesive (Araldite) was applied to the side of the insulating layer. The substrate was turned upside down and copper of 1.6 mm t was allowed to adhere to an FR-4 substrate, the entire surface of which was etched and cured at 60° C. for 5 hours. After curing, the copper foil attached to the insulating layer was cut out at a width of 1 cm. A peel test was performed by peeling the copper foil at an angle of 90° and peel strength was obtained by a peel gauge.

○: 6N or more.

Δ: 3N or more and less than 6N.

×: less than 3N.

<Storage Stability>

A copper clad laminate having a copper thickness of 30 μm was prepared and pretreated with CZ8100 manufactured by MEC Co., Ltd. To the substrate, a dry film according to each of Examples and Comparative Examples was allowed to adhere such that the dry film came into contact with a L1 layer by use of a vacuum laminator. In this manner, a double-layered curable resin layer was formed.

The test substrates obtained in this manner were stored in a constant-temperature tank of 30° C. for 24 hours, developed and evaluated for storage stability based on the following criteria.

○: Development time does not increase.

Δ: Development time increases by 30% or more relative to the initial value.

×: Development residue is produced.

<PCT Resistance>

The non-electrolytic metal plated evaluation substrates were placed in a high pressure/high temperature/high humidity vessel (121° C. and 2 atm. and 100% humidity) for 300 hours. The state-change of each resin insulating layer was evaluated based on the following evaluation criteria.

○: Neither significant bulge nor discoloration were observed.

Δ: No significant peeling is observed. Peeling partly occurs or discoloration is observed.

×: Significant bulge and discoloration are observed.

<Electric Characteristics>

Using a comb electrode pattern having a line/space=50/50 μm, evaluation substrates were prepared in the above conditions and evaluated for electric characteristics (insulation reliability, electrode corrosivity).

Evaluation method was as follows. To the comb electrode, a bias voltage of DC 30V was applied in heating and humidifying conditions (121° C., 97% R.H.) and time until the occurrence of insulation deterioration was measured. Insulation deterioration herein was determined when an ohmic value reached below $1\times10^{-6}\Omega$.

The evaluation criteria are as follows:
◎: Time until the occurrence of insulation deterioration is 200 hours or more.
Δ: Time until the occurrence of insulation deterioration is 100 hours to 200 hours.
×: Time until the occurrence of insulation deterioration is less than 100 hours.

<Developability>

A single-sided printed wiring substrate (a copper thickness of 15 μm) having a circuit formed thereon was prepared and pretreated with CZ8100 manufactured by MEC Co., Ltd. To the substrate, a dry film according to each of Examples and Comparative Examples was allowed to adhere such that a L1 layer came into contact with the substrate by use of a vacuum laminator in the conditions of 100° C.×60 seconds to form a double layered curable resin layer on the substrate. The resultant curable resin layer was developed with a 1 wt. % aqueous sodium carbonate solution at 30° C. and a spray pressure of 0.2 MPa for 60 seconds and developability was checked. The evaluation items are as follows:
○: No residue is observed and development can be made.
×: Residue remains.

TABLE 5

| Property test | Example | | | | | | | | Comparative Example | | |
|---|---|---|---|---|---|---|---|---|---|---|---|
| | 5 | 6 | 7 | 8 | 9 | 10 | 11 | 12 | 4 | 5 | 6 |
| Peel strength | ○ | ○ | ○ | ○ | ○ | ○ | ○ | ○ | Δ | Δ | × |
| Storage stability | ○ | ○ | ○ | ○ | ○ | ○ | ○ | ○ | × | × | ○ |
| PCT resistance | ○ | ○ | ○ | ○ | ○ | ○ | ○ | ○ | ○ | ○ | × |
| Electric characteristics | ○ | ○ | ○ | ○ | ○ | ○ | ○ | ◎ | × | × | ○ |
| Developability | ○ | ○ | ○ | ○ | ○ | ○ | ○ | ○ | × | × | × |

As is apparent from the above results, Examples 5 to 12 where a L1 layer of the present invention was used were excellent in all characteristic tests. Particularly, in the case where P-containing compound was used as a curing catalyst of a L2 layer, more excellent electric characteristics were obtained. Even after drying was carried out at a relatively high temperature, developability was satisfactory, and therefore, storage stability was found to be excellent.

In Comparative Examples 4 to 6 using a L1 layer containing no imidazole-isocyanate adduct of the present invention, two characteristics of peel strength, storage stability, PCT resistance and electric characteristics were unsatisfactory.

INDUSTRIAL APPLICABILITY

It is possible to provide a curable resin composition which shows a cured material excellent in insulation reliability while maintaining adhesiveness, and further provide a composition for forming a solder resist, a dry film and a printed wiring board using the curable resin composition.

REFERENCE SIGNS LIST

S: Substrate
L1, L2: Insulating resin layer

The invention claimed is:
1. A curable resin composition, comprising:
an imidazole-isocyanate adduct;
a carboxyl group-containing resin having an ethylenically unsaturated double bond in
a molecule thereof; and
a thermosetting resin,
wherein the imidazole-isocyanate adduct is a compound represented by formula C

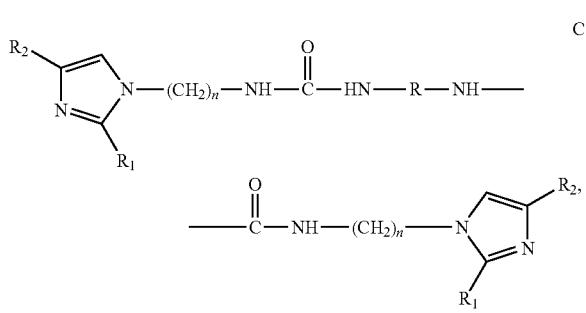

where n is 3 to 8,
R represents $(CH_2)_m$ where m is 2 to 8, or a polyvalent residue of a polymethylene poly(phenylisocvanate) having an average isocyanate functionality of 2.1 to 3.5, and
$R_1$ and $R_2$ each independently represent hydrogen, a $C_1$-$C_{20}$ linear or branched alkyl group, a $C_6$-$C_{10}$ aryl, alkylaryl or arylalkyl group, or a $C_5$-$C_6$ alicyclic group.

2. The curable resin composition according to claim 1, wherein the thermosetting resin is an epoxy resin.

3. The curable resin composition according to claim 1, further comprising:
a photopolymerization initiator; and
a reactive diluent.

4. A curable resin composition for forming a solder resist, comprising:
the curable resin composition according to claim 1.

5. A dry film, comprising:
a curable resin layer comprising the curable resin composition according to claim 1.

6. A printed wiring board, comprising:
a resin insulating layer obtained by thermally curing the curable resin composition according to claim 1.

7. A laminate, comprising:
a substrate; and
a plurality of resin insulating layers formed on the substrate,
wherein one of the plurality of resin insulating layers in contact with the substrate is a layer formed of the curable resin composition according to claim 1.

8. The laminate according to claim 7, wherein at least one resin insulating layer except the resin insulating layer in contact with the substrate is formed of a curable resin composition different from the composition of the resin insulating layer in contact with the substrate.

9. The laminate according to claim 7, wherein at least one resin insulating layer except the resin insulating layer in contact with the substrate is formed of a curable resin composition containing no imidazole-isocyanate adduct.

10. The laminate according to claim 7, wherein at least one resin insulating layer except the resin insulating layer in contact with the substrate is formed of a curable resin composition comprising a P-atom containing curing accelerator.

11. A dry film for preparing the laminate according to claim 7, comprising:
a film; and
a plurality of curable resin layers formed on the film,
wherein a layer of the plurality of curable resin layers in contact with the film or an outermost layer of the plurality of curable resin layers, is formed of the curable resin composition comprising the imidazole-isocyanate adduct.

12. A process for preparing a laminate, comprising:
laminating the dry film according to claim 11 on a substrate such that the curable resin layer formed of the curable resin composition comprising the imidazole-isocyanate adduct comes into contact with a surface of the substrate.

13. A curable resin composition, comprising:
an imidazole-isocyanate adduct;
a carboxyl group-containing resin; and
a thermosetting resin,
wherein the imidazole-isocyanate adduct is a compound represented by formula C

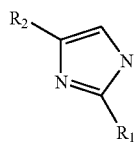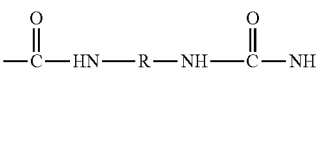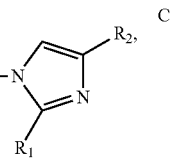    C where n is 3 to 8,
R represents $(CH_2)_m$ where m is 2 to 8, or a polyvalent residue of a polymethylene poly(phenylisocyanate) having an average isocyanate functionality of 2.1 to 3.5,
$R_1$ and $R_2$ each independently represent hydrogen, a $C_1$-$C_{20}$ linear or branched alkyl group, a $C_6$-$C_{10}$ aryl, alkylaryl or arylalkyl group, or a $C_5$-$C_6$ alicyclic group, and
the carboxyl group-containing resin is one of (1)-(11),
(1) a carboxyl group-containing photosensitive resin obtained by a process including reacting a compound having a plurality of phenolic hydroxy groups in a molecule thereof with an alkylene oxide to obtain a first reaction product, reacting the first reaction product with an unsaturated group-containing monocarboxylic acid to obtain a second reaction product, and reacting a polybasic acid anhydride with the second reaction product,
(2) a carboxyl group-containing photosensitive resin obtained by a process including reacting a (meth)acrylic acid with a bifunctional or a polyfunctional epoxy resin, and adding a dibasic anhydride to a hydroxyl group present in a side chain,
(3) a carboxyl group-containing photosensitive resin obtained by a process including further epoxylating a hydroxyl group of a bifunctional epoxy resin with epichlorohydrin to obtain a polyfunctional epoxy resin, reacting the polyfunctional epoxy resin with a (meth) acrylic acid, and adding a dibasic anhydride to a resultant hydroxyl group,
(4) a carboxyl group-containing photosensitive resin obtained by a process including reacting a compound having a plurality of phenolic hydroxy groups in a molecule thereof with a cyclic carbonate compound to obtain a first reaction product, reacting the first reaction product with an unsaturated group-containing monocarboxylic acid to obtain a second reaction product, and reacting a polybasic acid anhydride to the second reaction product,
(5) a carboxyl group-containing photosensitive urethane resin obtained by a polyaddition reaction among a diisocyanate, a (meth)acrylate of a bifunctional epoxy resin or a partially modified acid anhydride thereof, a carboxyl group-containing dialcohol compound, and a diol compound,
(6) a carboxyl group-containing non-photosensitive resin obtained by copolymerization of an unsaturated carboxylic acid with an unsaturated group-containing compound,
(7) a carboxyl group-containing non-photosensitive urethane resin obtained by a polyaddition reaction among a diisocyanate, a carboxyl group-containing dialcohol compound, and a diol compound,
(8) a carboxyl group-containing resin obtained by a process including reacting a bifunctional oxetane resin with a dicarboxylic acid, and adding a dibasic anhydride to a resultant primary hydroxyl group,
(9) a carboxyl group-containing photosensitive urethane resin terminated with a (meth)acryl group, obtained by a process including adding a compound having one hydroxyl group and at least one (meth)acryloyl group in a molecule thereof to a system during a synthesis of the resin (5) or (7),
(10) a carboxyl group-containing photosensitive urethane resin terminated with a (meth)acryl group, obtained by a process including adding a compound having one isocyanate group and at least one (meth)acryloyl group in a molecule thereof to a system during a synthesis of the resin (5) or (7), and
(11) a carboxyl group-containing photosensitive resin obtained by further adding a compound having one epoxy group and at least one (meth)acryloyl group in a molecule thereof to one of the resins (1) to (10).

14. The curable resin composition according to claim 13, wherein the thermosetting resin is an epoxy resin.

15. The curable resin composition according to claim 13, further comprising:
a photopolymerization initiator; and
a reactive diluent.

16. The curable resin composition according to claim 14, further comprising:
a photopolymerization initiator; and
a reactive diluent.

17. The curable resin composition according to claim 2, further comprising:
a photopolymerization initiator; and
a reactive diluent.

18. The curable resin composition according to claim 1, wherein the imidazole-isocyanate adduct is included in an amount of from 0.1 to 50 parts by mass based on 100 parts by mass of the thermosetting resin.

19. The curable resin composition according to claim 1, wherein the carboxyl group-containing resin is included in an amount of 20% by mass to 60% by mass with respect to a total amount of the curable resin composition.

20. The curable resin composition according to claim 1, wherein the imidazole-isocyanate adduct is included in an amount of from 0.5 to 10 parts by mass based on 100 parts by mass of the thermosetting resin, and the carboxyl group-containing resin is included in an amount of from 30% by mass to 60% by mass with respect to a total amount of the curable resin composition.

* * * * *